US012288536B2

(12) United States Patent
Lin et al.

(10) Patent No.: US 12,288,536 B2
(45) Date of Patent: Apr. 29, 2025

(54) DISPLAY PANEL, METHOD FOR DRIVING THE SAME AND DISPLAY DEVICE

(71) Applicant: Xiamen Tianma Micro-Electronics Co., Ltd., Xiamen (CN)

(72) Inventors: Meihong Lin, Xiamen (CN); Yuchao Wang, Xiamen (CN); Yanping Yu, Xiamen (CN)

(73) Assignee: Xiamen Tianma Micro-Electronics Co., Ltd., Xiamen (CN)

( * ) Notice: Subject to any disclaimer, the term of this patent is extended or adjusted under 35 U.S.C. 154(b) by 0 days.

(21) Appl. No.: 18/413,298

(22) Filed: Jan. 16, 2024

(65) Prior Publication Data
US 2024/0153965 A1    May 9, 2024

(30) Foreign Application Priority Data

Jun. 30, 2023 (CN) .......................... 202310798010.3

(51) Int. Cl.
*G09G 3/36* (2006.01)
*G02F 1/1335* (2006.01)
*G02F 1/1362* (2006.01)
*G02F 1/1368* (2006.01)
(Continued)

(52) U.S. Cl.
CPC ..... *G09G 3/3648* (2013.01); *G02F 1/133512* (2013.01); *G02F 1/136286* (2013.01); *G02F 1/1368* (2013.01); *H10D 86/441* (2025.01); *H10D 86/60* (2025.01);
(Continued)

(58) Field of Classification Search
CPC ............ H01L 27/124; G02F 1/133512; G02F 1/136286; G02F 1/1368; G02F 1/134372; G02F 1/136209; G02F 1/1323; G02F 1/13306; G02F 1/134309; G02F 1/134318; G02F 1/134345; G09G 3/3648; G09G 2310/08; G09G 2320/0626; G09G 2320/068; G09G 2330/021
See application file for complete search history.

(56) References Cited

U.S. PATENT DOCUMENTS

2018/0157131 A1* 6/2018 Oh .................. G02F 1/134309
2019/0265535 A1* 8/2019 Wakabayashi .... G02F 1/133345
2021/0397062 A1* 12/2021 Hsiang .................. G02F 1/1677

FOREIGN PATENT DOCUMENTS

CN          113885264 A    1/2022
CN          110376773 B    2/2022

* cited by examiner

*Primary Examiner* — Premal R Patel
(74) *Attorney, Agent, or Firm* — CHRISTENSEN O'CONNOR JOHNSON KINDNESS PLLC

(57) ABSTRACT

A display panel, a method for driving the display panel, and a display device are provided. In an embodiment, the display panel includes: a first substrate; a display dielectric layer located at a side of the first substrate; pixel electrodes and peek-proof electrodes, all of the pixel electrodes and the peek-proof electrodes being arranged between the first substrate and the display dielectric layer; and a light-shielding structural layer including a light-shielding structure and a hollow-out portion. In an embodiment, along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel.

20 Claims, 30 Drawing Sheets

(51) Int. Cl.
*H10D 86/40* (2025.01)
*H10D 86/60* (2025.01)

(52) U.S. Cl.
CPC . *G09G 2310/08* (2013.01); *G09G 2320/0626* (2013.01); *G09G 2320/068* (2013.01); *G09G 2330/021* (2013.01)

DISPLAY PANEL, METHOD FOR DRIVING THE SAME AND DISPLAY DEVICE

CROSS-REFERENCE TO RELATED APPLICATIONS

The present application claims priority to Chinese Patent Application No. 202310798010.3, filed on Jun. 30, 2023, the content of which is incorporated herein by reference in its entirety.

TECHNICAL FIELD

The present disclosure relates to the technical field of displays, and in particular to a display panel, a method for driving the display panel, and a display device.

BACKGROUND

With constant development of display technologies, peek-proof display has become a desirable function of a display device. There are at least three methods to realize the peek-proof display, including white-state peek prevention, black-state peek prevention and use of a peek-proof film. The white-state peek prevention has received great attention because of its low cost and wide applicable range.

However, the existing white-state peek prevention is realized at the expense of light under a wide viewing angle (WVA), thereby reducing brightness of the display panel and increasing power consumption of the display panel. A light control structure is used in the existing white-state peek prevention to cause a higher cost, a more difficult process or a larger thickness of the display panel.

SUMMARY

In view of this, aspects of the present disclosure provide a display panel, a method for driving a display panel, and a display device, to solve the above problems.

According to an aspect, the present disclosure provides a display panel, including: a first substrate; a display dielectric layer located at a side of the first substrate; pixel electrodes and peek-proof electrodes, all of the pixel electrodes and the peek-proof electrodes being arranged between the first substrate and the display dielectric layer; and a light-shielding structural layer including a light-shielding structure and a hollow-out portion. In an embodiment, along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel.

According to another aspect, the present disclosure provides a method for driving a display panel, including: a first substrate; a display dielectric layer located at a side of the first substrate; pixel electrodes and peek-proof electrodes, all of the pixel electrodes and the peek-proof electrodes being arranged between the first substrate and the display dielectric layer; and a light-shielding structural layer including a light-shielding structure and a hollow-out portion. In an embodiment, along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel. In an embodiment, a display mode of the display panel includes a first mode and a second mode, and the method includes: controlling, in the first mode, one of the pixel electrodes and one of the peek-proof electrodes to respectively receive a voltage signal, such that the display panel achieves a narrow viewing angle (NVA) display; and controlling, in the second mode, one of the pixel electrodes to receive a voltage signal and none of the peek-proof electrodes receives a voltage signal, such that the display panel achieves wide viewing angle (WVA) display.

According to another aspect, the present disclosure provides a display device, including a display panel including: a first substrate; a display dielectric layer located at a side of the first substrate; pixel electrodes and peek-proof electrodes, all of the pixel electrodes and the peek-proof electrodes being arranged between the first substrate and the display dielectric layer; and a light-shielding structural layer including a light-shielding structure and a hollow-out portion. In an embodiment, along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel.

According to the embodiments of the present disclosure, by providing the peek-proof electrodes and controlling whether the peek-proof electrodes receive a voltage signal, the display device can switch the display mode of the display panel between a peek-proof mode (first mode) and a non-peek-proof mode (second mode).

BRIEF DESCRIPTION OF DRAWINGS

To better describe the technical solutions of the embodiments of the present disclosure, the accompanying drawings required in the embodiments are briefly described in the following. It should be noted that, the accompanying drawings in the following description show merely some examples of the present disclosure, and a person of ordinary skill in the art can derive other drawings from these accompanying drawings without creative efforts.

DESCRIPTION OF EMBODIMENTS

For better illustrate the technical solutions of the present disclosure, the following describes in detail the embodiments of the present disclosure with reference to the accompanying drawings.

It should be noted that, the described embodiments are merely some but not all of the embodiments of the present disclosure. Based on the embodiments of the present disclosure, all other embodiments obtained by a person of ordinary skill in the art without creative efforts fall within a scope of the present disclosure.

Terms in the embodiments of the present disclosure are merely used to describe the specific embodiments, and are not intended to limit the present disclosure. Unless otherwise specified in the context, words, such as "a", "the", and "this", in a singular form in the embodiments and appended claims of the present disclosure include plural forms.

It should be understood that the term "and/or" in this specification merely describes associations between associated objects, and it indicates three types of relationships. For example, A and/or B may indicate that A exists alone, A and B coexist, or B exists alone. In addition, the character "/" in this specification generally indicates that the associated objects are in an "or" relationship.

In the description of this specification, it should be understood that the terms such as "substantially", "approximate to", "approximately", "about", "roughly", and "in general" described in the claims and embodiments of the present disclosure mean general agreement within a reasonable process operation range or tolerance range, rather than an exact value.

It should be understood that although the terms such as first, second, and third may be used to describe transistors, switches, data lines and scanning lines in the embodiments of the present disclosure, these transistors, switches, data lines and scanning lines should not be limited to these terms. These terms are used only to distinguish the transistors, switches, data lines and scanning lines from each other. For example, without departing from the scope of the embodiments of the present disclosure, a first transistor may also be referred to as a second transistor, and similarly, a second transistor may also be referred to as a first transistor.

The Applicant of the present disclosure provided a solution to the problem existing in the related art through careful and in-depth research.

Figure 1:
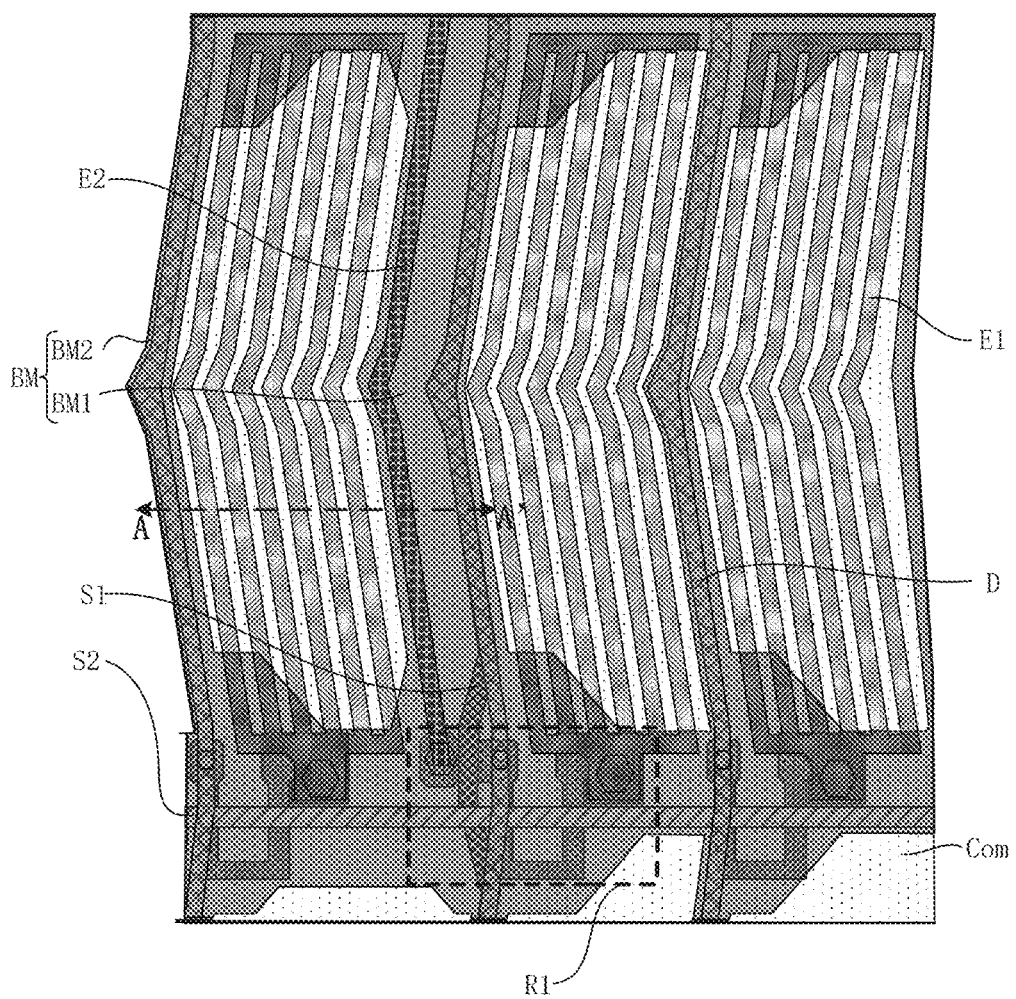
FIG. 1 is a schematic partial view of a display panel according to an embodiment of the present disclosure.
Figure 2:
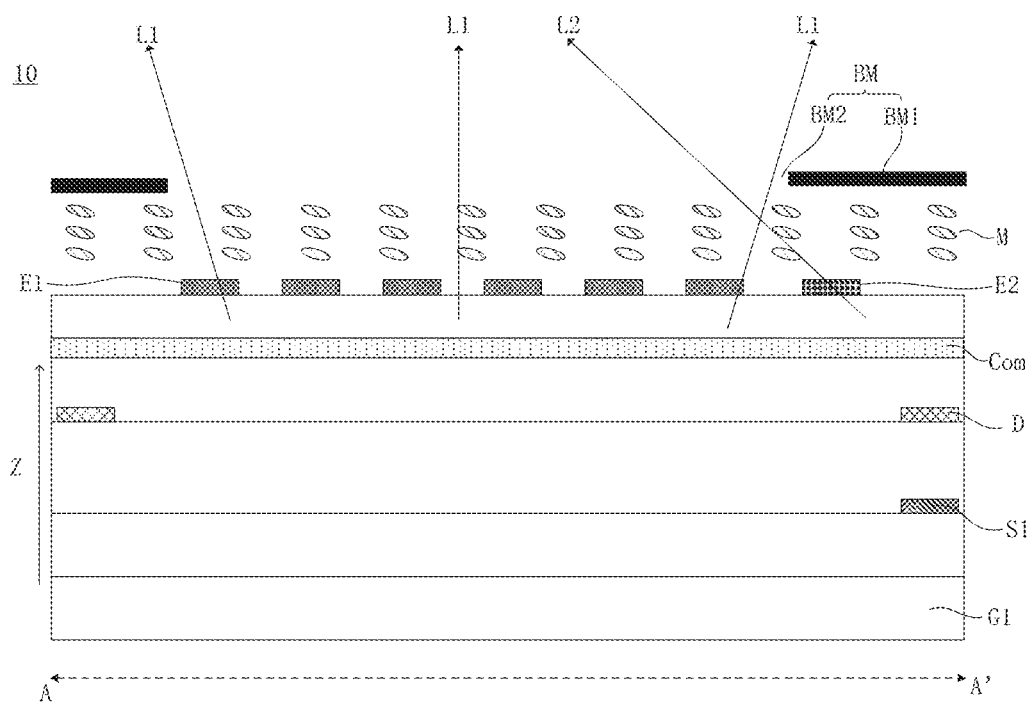
FIG. 2 is a schematic sectional view of a partial region along AA' shown in FIG. 1 according to an embodiment of the present disclosure.

FIG. 1 is a schematic partial view of a display panel according to an embodiment of the present disclosure. FIG. 2 is a schematic sectional view of a partial region along AA' shown in FIG. 1.

According to existing white-state peek prevention, a light control structure is usually needed to be provided in a display panel to obtain collimated light. The collimated light is propagated to eyes of an observer under a front viewing angle, and not to eyes of an observer under a WVA. Namely, the collimated light is viewed by the observer under the front viewing angle, and not viewed by the observer under the WVA, to realize peek prevention of the display panel. The light control structure is to obstruct light rays under the WVA. This means that many light rays are abandoned to reduce a brightness of the display panel. For the sake of a higher brightness, a driving voltage needs to be increased to increase power consumption. The light control structure may be a staggered light-shielding structure having distinct layers, and may also be a light control liquid crystal box. However, the staggered light-shielding structure having distinct layers makes the process and manufacture of the display panel more difficult, with a higher cost. The light control liquid crystal box also increases a cost. Moreover, to control the light control liquid crystal box, additional power consumption will be caused, and the display panel will be thicker.

In view of limitations of the existing white-state peek prevention, an embodiment of the present disclosure provides a display panel 10. Referring to FIG. 1 and FIG. 2, the display panel 10 includes a first substrate G1, a display dielectric layer M, a plurality of pixel electrodes E1, peek-proof electrodes E2, and a light-shielding structural layer BM.

The display dielectric layer M is located at a side of the first substrate. The pixel electrodes E1 and the peek-proof electrodes E2 are located between the display dielectric layer M and the first substrate G1. The pixel electrodes E1 and the peek-proof electrodes E2 may be conductive film layers on the first substrate G1, and may be prepared with a same process. For example, they may use a same film forming process and a same etching process. The pixel electrodes E1 and the peek-proof electrodes E2 are provided on the first substrate G1, with signals directly transmitted by a signal line on the first substrate G1. This makes the pixel electrodes E1 and the peek-proof electrodes E2 acquire signals more easily.

In different states of the display dielectric layer M, light rays entering the display dielectric layer M may outgo in different states. The display dielectric layer M may be a liquid crystal layer. By deflecting a crystal array in the liquid crystal layer, a propagation direction of entered display light may be changed, so as to control the display light to pass through or not to pass through the display dielectric layer M.

The pixel electrodes E1 may receive a voltage signal, and generate an electric field with a common electrode Com, thereby controlling different states of the display dielectric layer M, adjusting a transmittance of the display light in the display dielectric layer M, and allowing a display device to form a display image.

The peek-proof electrodes E2 may receive a voltage signal, and generate an electric field with the common electrode Com, thereby controlling different states of the display dielectric layer M, and changing an outgoing state of the display light entering the display dielectric layer M.

Display light passing through the display dielectric layer M includes first display light L1 and second display light L2. The first display light L1 is display light with a state outgoing from the display dielectric layer M affected by the pixel electrodes E1. The second display light L2 is display light with a state outgoing from the display dielectric layer M affected by the peek-proof electrodes E2.

The light-shielding structural layer BM includes a light-shielding structure BM1 and a hollow-out portion BM2. Referring to FIG. 1 and FIG. 2, along a direction Z perpendicular to a plane of the display panel 10, the peek-proof electrode E2 overlaps with the light-shielding structure BM1, and the pixel electrode E1 at least a partially overlaps with the hollow-out portion BM2.

Along the direction Z perpendicular to the plane of the display panel 10, the hollow-out portion overlaps with the pixel electrode E1. That is, the hollow-out portion BM2 of the light-shielding structural layer BM exposes at least part of the pixel electrode E1, such that at least part of the first display light L1 exits from the display panel to form a display image. Meanwhile, along the direction Z perpendicular to the plane of the display panel 10, the light-shielding structure of the light-shielding structural layer BM at least partially overlaps with wirings in a display region of the display panel 10, and the light-shielding structural layer BM is located at a side of the wirings adjacent to a light exit surface of the display panel. This makes the wiring less visible in display of the display panel 10, thereby improving the display effect.

Along the direction Z perpendicular to the plane of the display panel 10, the peek-proof electrode E2 overlaps with the light-shielding structure BM1. The light-shielding structure BM1 at least partially shades the peek-proof electrode E2, such that the peek-proof electrode E2 is not observed by human eyes to affect a visual effect. In addition, according to a voltage received by the peek-proof electrode E2, when the second display light L2 reaches the display dielectric layer M, because of the light-shielding effect of the light-shielding structure BM1, the second display light L2 cannot be viewed by an observer under a front viewing angle or an NVA. Therefore, for the observer under a front viewing angle or an NVA, the display panel can show normal display. However, the second display light L2 exits from the hollow-out portion BM2, and the second display light L2 outgoing from the hollow-out portion BM2 has a large propagation angle. Then, the second display light L2 is received by an observer under a WVA, that is, the observer will receive light not included by the display image, and the second display light L2 causes interference to the observer under a WVA. Therefore, the display panel can realize a peek-proof function. It is to be noted that before propagated to the display dielectric layer M, the second display light L2 may be backlight under a region of the peek-proof electrode E2, and may also be backlight under a region under an adjacent pixel. That is, the second display light L2 formed after passing through the display dielectric layer M may come from light under the region of the peek-proof electrode E2, and may also come from light under the region of an adjacent pixel.

In an embodiment of the present disclosure, as shown in FIG. 2, the peek-proof electrode E2 and the pixel electrode E1 may be provided on a same layer. In this case, the peek-proof electrode E2 and the pixel electrode E1 may be formed in a same process. For example, both the peek-proof electrode and the pixel electrode are formed in a same film forming process and in a same etching process, thereby shortening a manufacturing period and reducing a cost.

In an embodiment of the present disclosure, a display mode of the display panel 10 includes a first mode. As shown in FIG. 2, in the first mode, at least some of the pixel electrodes E1 and at least some of the peek-proof electrodes E2 in the display panel 10 receive a voltage signal, respectively. In the first mode, at least a partial region of the display panel 10 may project first display light L1. The first display light L1 can be viewed by an observer under the front viewing angle and the NVA. The observer under the WVA can view second display light L2, and the observer under the WVA view a display image interfered by the second display light L2. Therefore, the display panel 10 achieves NVA display.

Figure 3:
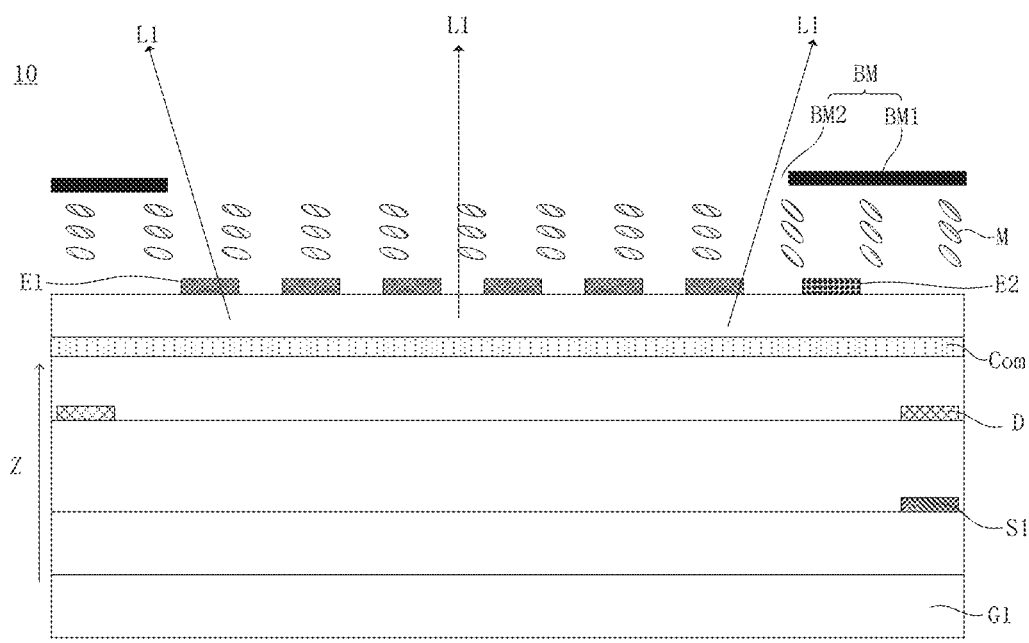
FIG. 3 is a schematic display diagram of a display panel according to an embodiment of the present disclosure.

FIG. 3 is a schematic display diagram of a display panel according to an embodiment of the present disclosure.

In an embodiment of the present disclosure, the display mode of the display panel 10 includes a second mode. As shown in FIG. 3, in the second mode, at least some of the pixel electrodes E1 in the display panel 10 receive a voltage signal, while none of the peek-proof electrodes E2 receives a voltage signal. In the second mode, no second display light L2 exits from the display panel. A display image that can be viewed by the observer under the WVA is not interfered with the second display light L2. Therefore, the display panel 10 achieves WVA display.

In the embodiments of the present disclosure, with two display modes of the display panel 10, the display panel 10 can be switched between a peek-proof mode and a non-peek-proof mode. This makes peek-proof display of the display panel 10 more flexible, thereby improving a peek-proof display effect.

Figure 4:
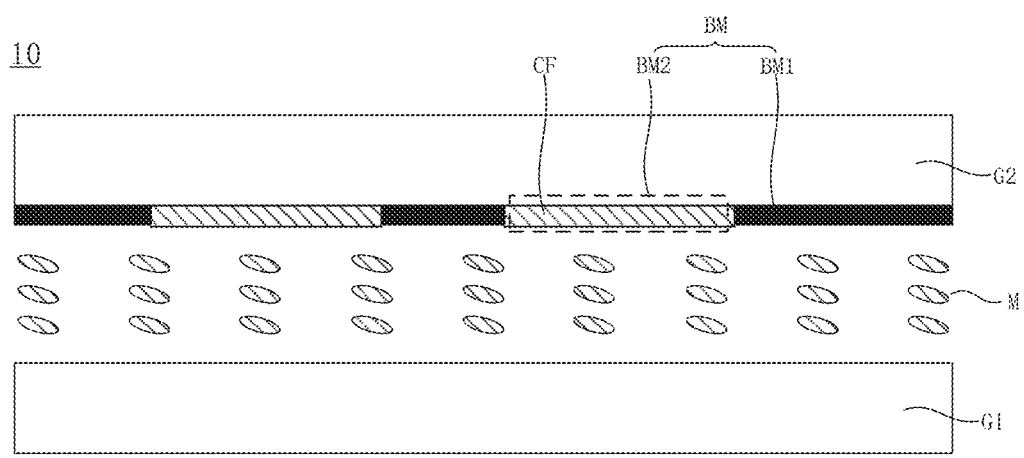
FIG. 4 is a schematic sectional view of a display panel according to an embodiment of the present disclosure.
Figure 5:
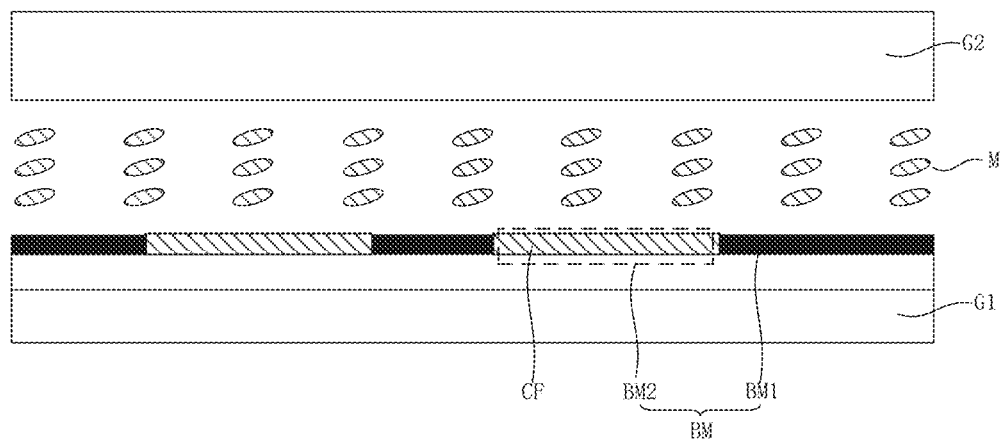
FIG. 5 is a schematic sectional view of another display panel according to an embodiment of the present disclosure.

FIG. 4 is a schematic sectional view of a display panel according to an embodiment of the present disclosure. FIG. 5 is a schematic sectional view of another display panel according to an embodiment of the present disclosure.

In an embodiment of the present disclosure, the display panel may further include a second substrate G2. The first substrate G1 is arranged opposite to the second substrate G2. The light-shielding structural layer BM is located between the first substrate G1 and the second substrate G2. The light-shielding structural layer BM is provided at a side of the first substrate G1 or the second substrate G2 adjacent to the display dielectric layer M.

For example, as shown in FIG. 4, the light-shielding structural layer BM is located at a side of the second substrate G2 adjacent to the first substrate G1, and located between the second substrate G2 and the display dielectric layer M.

For example, as shown in FIG. 5, the light-shielding structural layer BM is located at a side of the first substrate G1 adjacent to the second substrate G2, and located between the first substrate G1 and the display dielectric layer M.

In a layer where the light-shielding structural layer BM is located, the hollow-out portion BM2 may be filled with a color resist CF. The color resist CF can obstruct most ambient light from being irradiated onto the display panel 10 through the hollow-out portion BM2, so as not to affect work of structures such as a transistor in the display panel 10.

It is to be noted that structures such as the second substrate G2 and the color resist CF are only shown in FIG. 4 and FIG. 5 for ease of description.

The light-shielding structural layer BM may be made of a chromium metal or a black resin. Herein, there are no limits made on a material of the light-shielding structural layer BM.

In an embodiment of the present disclosure, as shown in FIG. 1, FIG. 2 and FIG. 3, along the direction Z perpendicular to the plane of the display panel 10, the light-shielding structure BM1 completely covers the peek-proof electrode E2. This can prevent the second display light L2 more effectively from being viewed by the observer under the front viewing angle or the NVA, thereby preventing the observer under the front viewing angle or the NVA from viewing an interfered display image, and thus achieving better visual experience of the observer.

Figure 6:
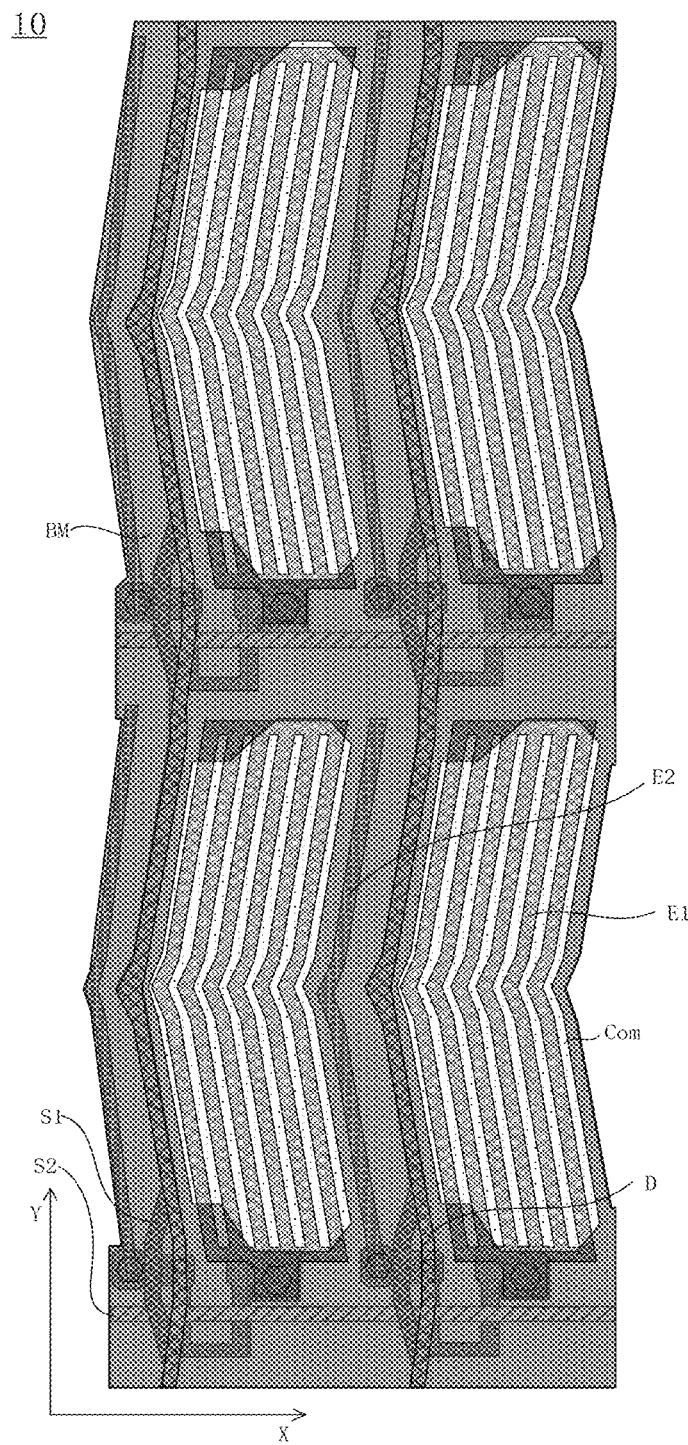
FIG. 6 is a schematic partial view of another display panel according to an embodiment of the present disclosure.
Figure 7:
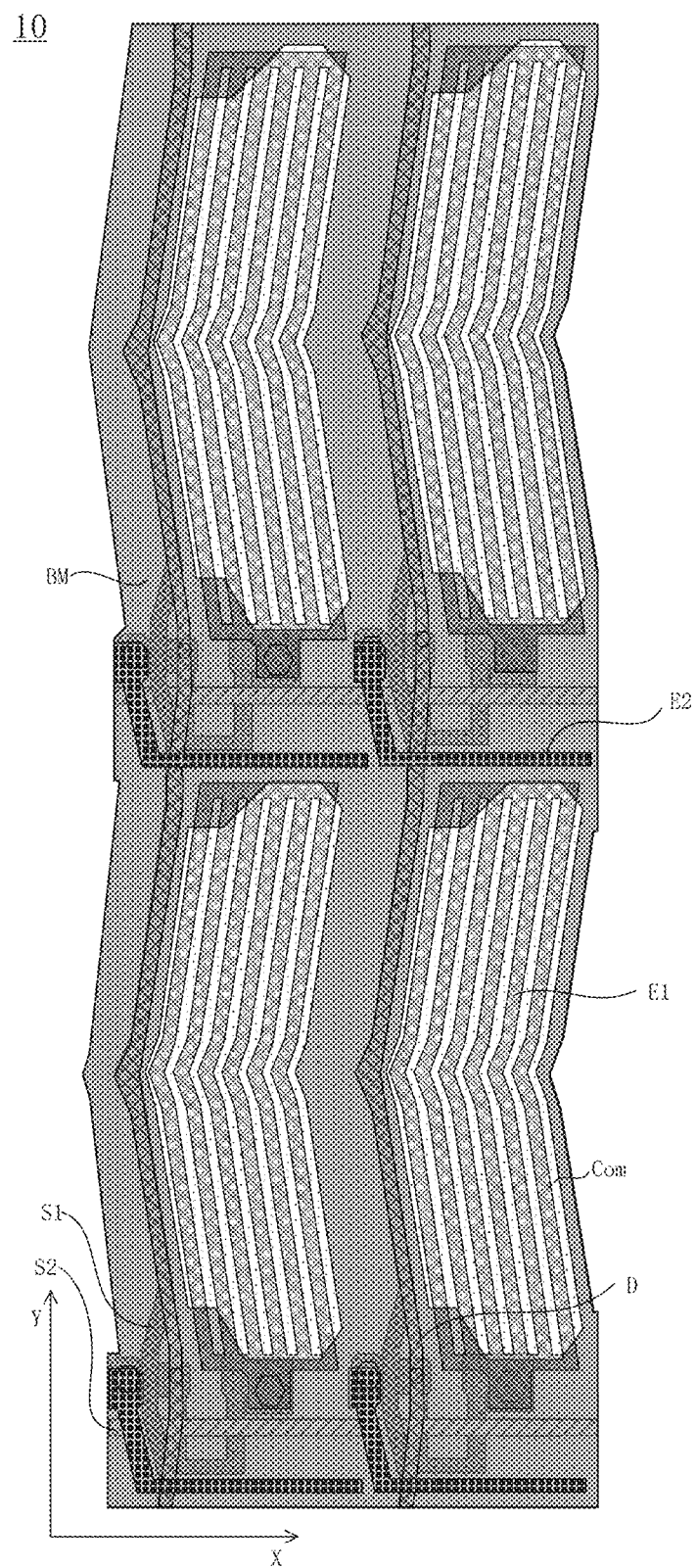
FIG. 7 is a schematic partial view of a display panel according to an embodiment of the present disclosure.
Figure 8:
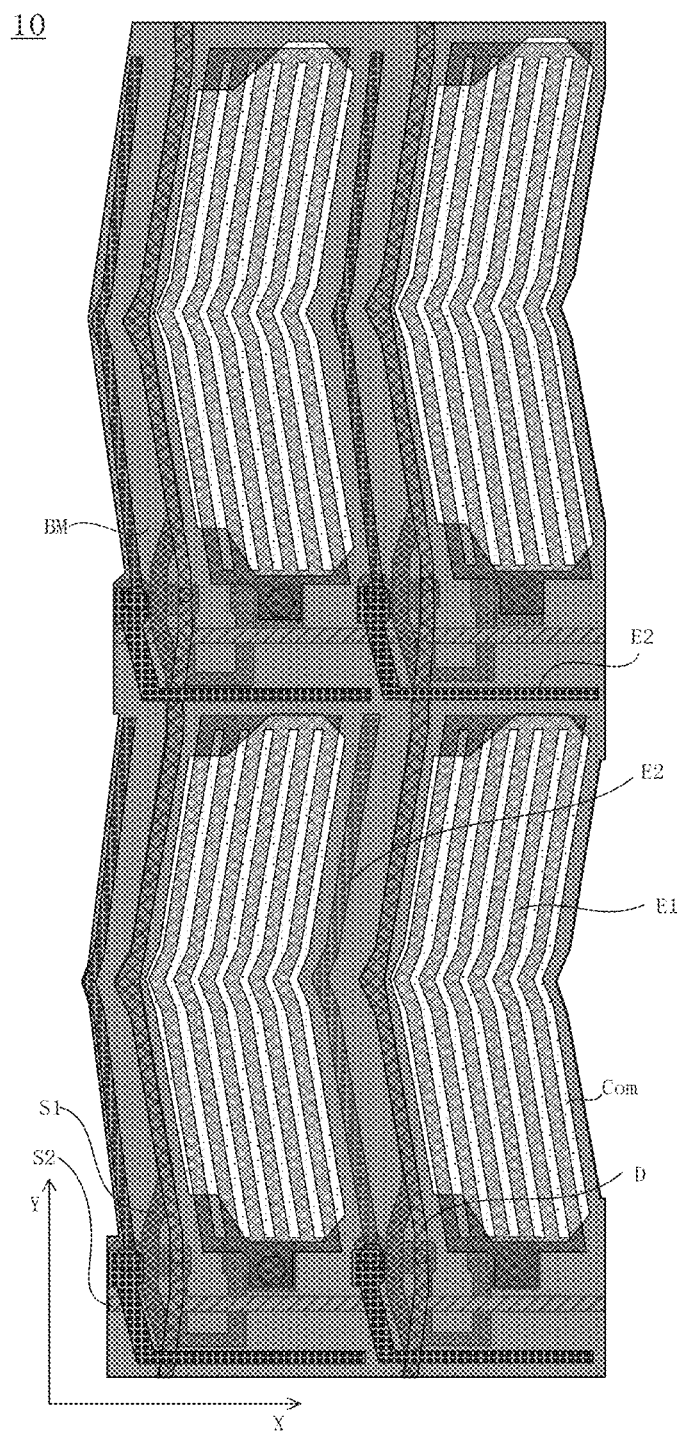
FIG. 8 is a schematic partial view of a display panel according to an embodiment of the present disclosure.

FIG. 6 is a schematic partial view of another display panel according to an embodiment of the present disclosure. FIG. 7 is a schematic partial view of a display panel according to an embodiment of the present disclosure. FIG. 8 is a schematic partial view of a display panel according to an embodiment of the present disclosure.

In an embodiment of the present disclosure, the peek-proof electrode E2 is located between adjacent pixel electrodes E1. In an example, the display panel 10 includes a plurality of sub-pixels. The sub-pixel includes the pixel electrode E1. The peek-proof electrode E2 may be located between adjacent sub-pixels. Referring to FIG. 6 to FIG. 8, the peek-proof electrode E2 is located between at least adjacent pixel electrodes E1 along a first direction X, and/or, the peek-proof electrode E2 is located between at least adjacent pixel electrodes E1 along a second direction Y. The first direction X is intersected with the second direction Y. For example, the first direction X is perpendicular to the second direction Y.

In an implementation, as shown in FIG. 6, the peek-proof electrode E2 is located between at least adjacent pixel electrodes E1 along the first direction X. In this case, a main portion of the peek-proof electrode E2 may approximately extend along the second direction Y, and the peek-proof electrode E2 does not occupy a space of the sub-pixel excessively in the first direction X.

In an implementation, as shown in FIG. 7, the peek-proof electrode E2 is located between at least adjacent pixel electrodes E1 along the second direction Y. In this case, the main portion of the peek-proof electrode E2 may approximately extend along the first direction X, and the peek-proof electrode E2 does not occupy a space of the sub-pixel excessively in the second direction Y.

In an implementation, as shown in FIG. 8, at least a part of the peek-proof electrodes E2 is located between at least adjacent pixel electrodes E1 along the first direction X, and at least another part of the peek-proof electrodes E2 is located between at least adjacent pixel electrodes E1 along the second direction Y. The main portion of the peek-proof electrode E2 located between the adjacent pixel electrodes E1 along the first direction X may approximately extend along the second direction Y. The main portion of the peek-proof electrode E2 located between the adjacent pixel electrodes E1 along the second direction Y may approximately extend along the first direction X.

It is to be noted that the peek-proof electrode E2 is provided between any adjacent pixel electrodes E1 along the first direction X, or the peek-proof electrode E2 is provided between some adjacent pixel electrodes E1 along the first direction X.

It is to be noted that the peek-proof electrode E2 is provided between any adjacent pixel electrodes E1 along the second direction Y, or the peek-proof electrode E2 is provided between some adjacent pixel electrodes E1 along the second direction Y.

In an embodiment of the present disclosure, by providing the peek-proof electrode E2 between pixel electrodes E1 in adjacent sub-pixels, a space of a wiring region between the adjacent sub-pixels is fully utilized.

For the image viewed by the observer under the WVA, with the adjacent peek-proof electrode E2 and pixel electrode E1, the second display light L2 interferes with the first display light L1 more effectively to achieve a better peek-proof effect. For example, when the pixel electrode E1 of one sub-pixel is adjacent to the peek-proof electrode E2, the second display light L2 corresponding to the peek-proof electrode E2 can mix with the first display light L1 emitted from the sub-pixel, thereby interfering the first display light L1 more effectively.

Figure 9:
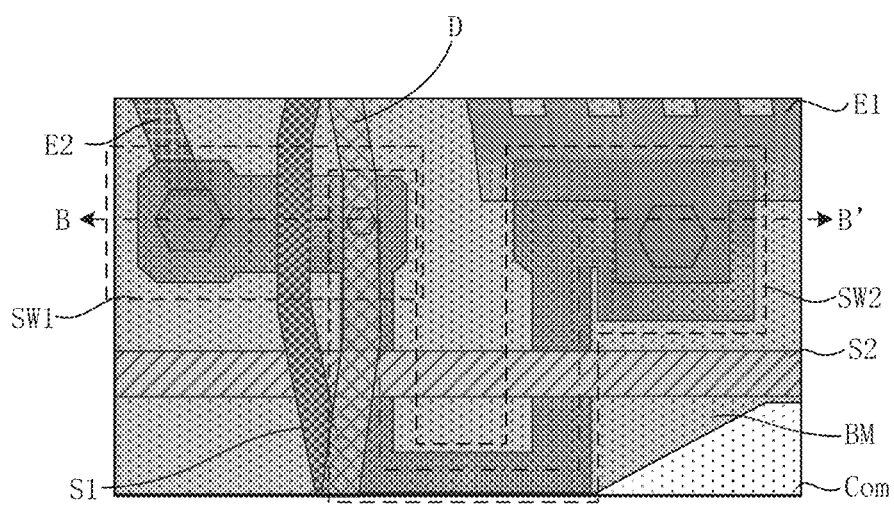
FIG. 9 is an enlarged view of a region R1 shown in FIG. 1 according to an embodiment of the present disclosure.
Figure 10:
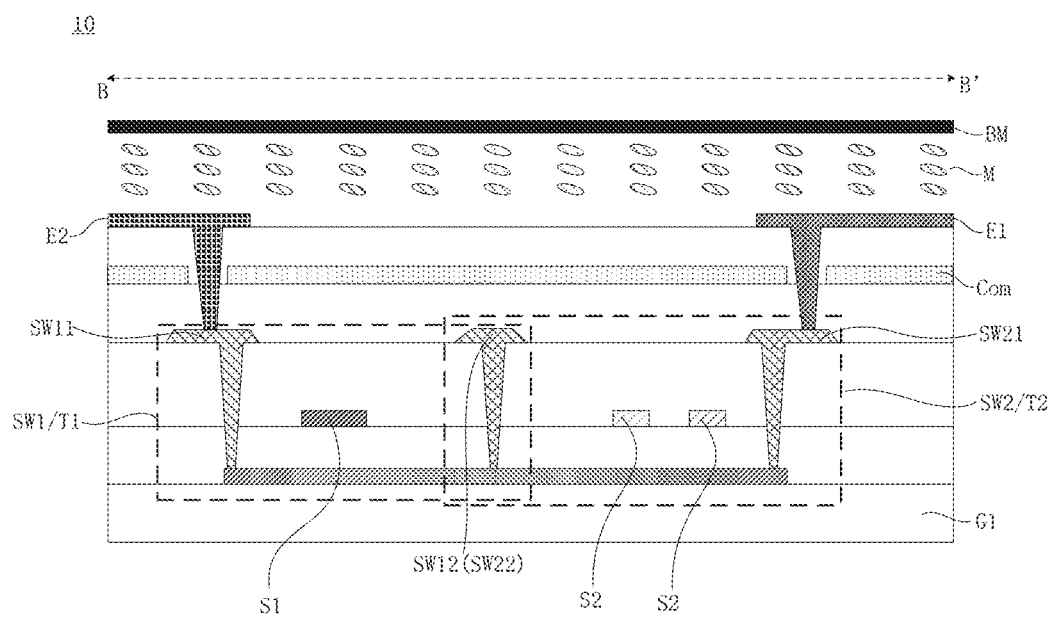
FIG. 10 is a schematic sectional view along BB' shown in FIG. 9 according to an embodiment of the present disclosure.

FIG. 9 is an enlarged view of a region R1 shown in FIG. 1. FIG. 10 is a schematic sectional view along BB' shown in FIG. 9.

Referring to FIG. 1, FIG. 9 and FIG. 10, the display panel 10 includes data lines D, a first switch SW1, and a second switch SW2. The peek-proof electrode E2 is electrically connected to the data line D through the first switch SW1. The first switch SW1 can control whether the peek-proof electrode E2 can receive a voltage signal on the data line D. The pixel electrode E1 is electrically connected to the data line D through the second switch SW2. The second switch SW2 can control whether the pixel electrode E1 can receive a voltage signal on the data line D.

For example, in response to the peek-proof mode of the display panel 10, both the first switch SW1 and the second switch SW2 are turned on, then both the peek-proof electrode E2 and the pixel electrode E1 receive a voltage signal to transmit an electrical signal. In response to a non-peek-proof mode of the display panel 10, the first switch SW1 is turned off and the second switch SW2 is turned on, then the pixel electrode E1 receives a data voltage and the peek-proof electrode E2 does not receive a voltage signal.

It is to be noted that the display panel 10 may realize the peek prevention regionally. That is, in response to the peek-proof mode of the display panel 10, some first switches SW1 are turned on, the peek-proof electrodes E2 electrically connected to these some first switches SW1 receive a voltage signal, and a region of these peek-proof electrodes E2 can realize the peek prevention; meanwhile, some other first switches SW1 are turned off, the peek-proof electrodes E2 electrically connected to these some other first switches SW1 cannot receive a voltage signal, and another region of these peek-proof electrodes E2 cannot realize the peek prevention.

The data line D may be a linear structure or a partial zigzag structure including a zigzag-shaped part. However, as shown in FIG. 6 to FIG. 8, a main portion of the data line D approximately extends along the second direction Y.

In an embodiment of the present disclosure, referring to FIG. 1 and FIG. 9, at least one of the peek-proof electrodes E2 and the pixel electrode E1 are electrically respectively connected to a same one of the data lines D through the first switch SW1 and the second switch SW2. At least some of the first switches SW1 and the second switches SW2 may be electrically connected to a same data line D. That is, at least one of the peek-proof electrodes E1 may receive a voltage signal same as a voltage signal of the pixel electrode E2. Referring to FIG. 1 and FIG. 9, the peek-proof electrode E2 is electrically connected to the data line D through the first switch SW1, and the data line D is electrically connected to the pixel electrode E1 through the second switch SW2.

For ease of electrical connection, the pixel electrode E1 and the peek-proof electrode E2 respectively electrically connected to a same data line D through the first switch SW1 and the second switch SW2 may be arranged adjacent to each other.

In an embodiment, the data line D transmitting the voltage signal for at least part of the peek-proof electrodes E1 and the data line D transmitting the voltage signal for the pixel electrode E2 may be shared. A number of the data lines D is not increased additionally for the peek-proof electrode E1. Therefore, neither a wiring difficulty nor a driving difficulty of the display panel is increased.

In addition, the peek-proof electrode E2 sharing the data line D with the pixel electrode E1 may receive the voltage signal synchronously with the pixel electrode in the peek-proof mode. This accelerates the response time of the peek-proof mode.

In an embodiment, at least one of the peek-proof electrodes E2 shares the data line D with the pixel electrode E1, while at least another one of the peek-proof electrodes E2 does not share the data line D with the pixel electrode E1. For example, the peek-proof electrode E2 located between adjacent pixel electrodes E1 along the first direction X may share the data line D with the pixel electrode E1. The peek-proof electrode E2 located between adjacent pixel electrodes E1 along the second direction Y does not share the data line D with the pixel electrode E1.

In an embodiment, each of the peek-proof electrodes E2 shares the data line D with the pixel electrode E1.

Figure 11:
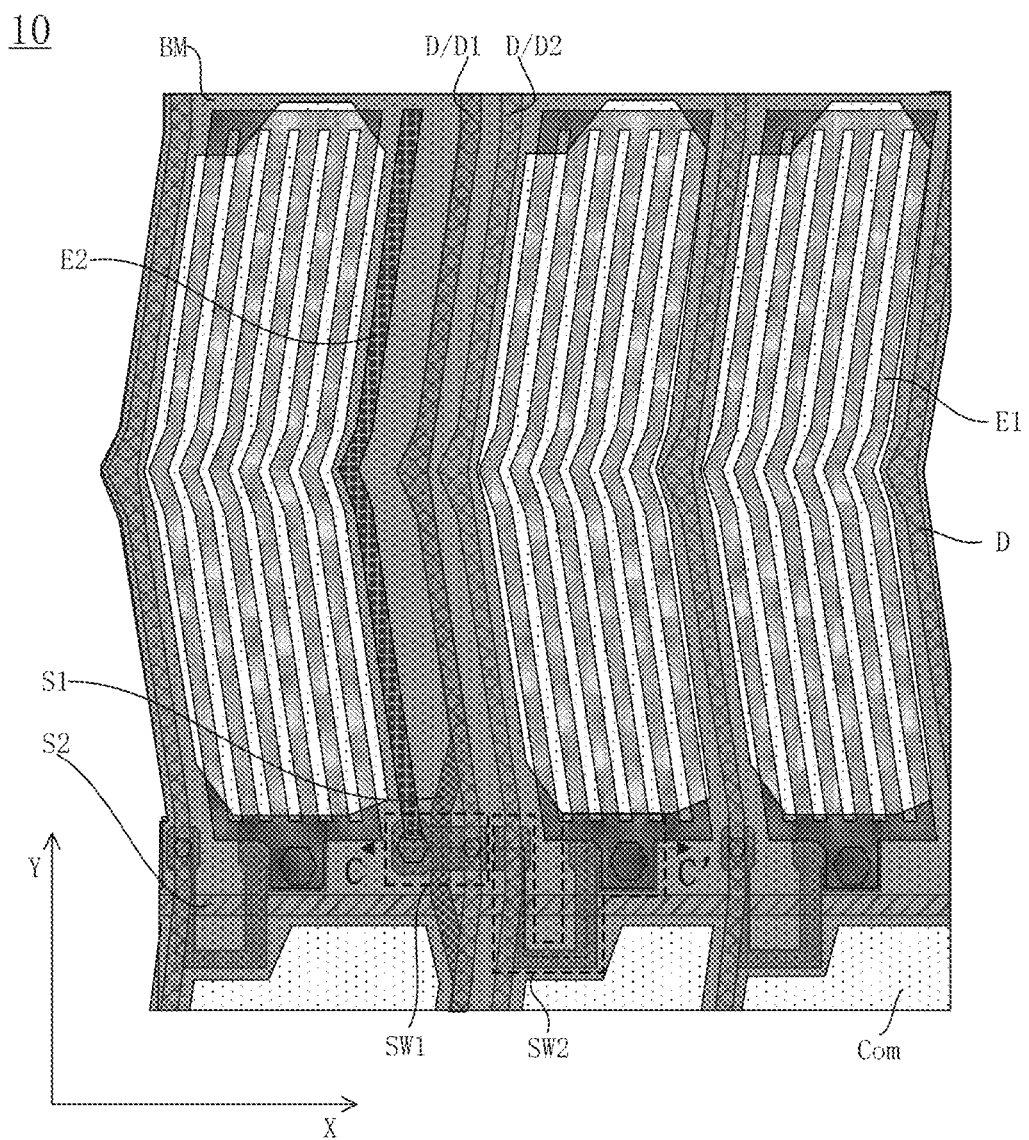
FIG. 11 is a schematic partial view of a display panel according to an embodiment of the present disclosure.
Figure 12:
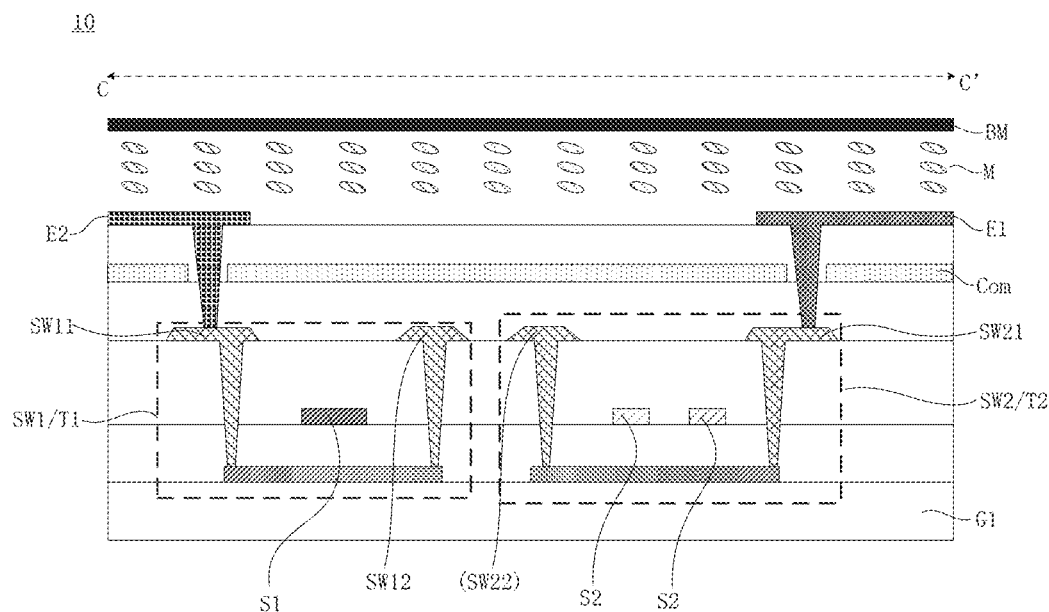
FIG. 12 is a schematic sectional view along CC' shown in FIG. 11 according to an embodiment of the present disclosure.

FIG. 11 is a schematic partial view of a display panel according to an embodiment of the present disclosure. FIG. 12 is a schematic sectional view along CC' shown FIG. 11.

In an embodiment of the present disclosure, referring to FIG. 11 and FIG. 12, the display panel 10 further includes a first data line D1, a second data line D2, a first switch SW1, and a second switch SW2. The peek-proof electrode E2 is electrically connected to the first data line D1 through the first switch SW1. The pixel electrode E1 is electrically connected to the second data line D2 through the second switch SW2. That is, among the data lines D included in the display panel, at least one of the data lines D transmits a voltage signal to the peek-proof electrode E2, and at least another one of the data lines D transmits a voltage signal to the pixel electrode E1. The data line D transmitting the voltage signal to the peek-proof electrode E2 is referred to as the first data line D1. The data line D transmitting the voltage signal to the pixel electrode E1 is referred to as the second data line D2.

In an embodiment of the present disclosure, in the peek-proof mode, the peek-proof electrode E2 and the pixel electrode E1 respectively receive the voltage signal transmitted by the first data line D1 and the voltage signal transmitted by the second data line D2. Then, the data signal received by the peek-proof electrode E2 may be different from or the same as the data signal received by the pixel electrode E1. Therefore, the display panel can achieve a more flexible peek-proof function. For example, the voltage signal received by the peek-proof electrode E2 is flexible and adjustable, such that the second display light L2 has a brightness that is more changeable, so that the display panel can achieve more peek-proof modes with different peek-proof effects.

In addition, the data line D electrically connected to the peek-proof electrode E2 is different from the data line D electrically connected to the pixel electrode E1. This can prevent an excessively large load on the data line D electrically connected to the pixel electrode E1 to cause a poor display effect.

As shown in FIG. 11 and FIG. 12, the first switch SW1 includes a first transistor T1. The second switch SW2 includes a second transistor T2. The first transistor T1 may be located between the peek-proof electrode E2 and the data line D, to control the peek-proof electrode E2 to receive the voltage signal on the data line D. The second transistor T2 may be located between the pixel electrode E1 and the data line D, to control the pixel electrode E1 to receive the voltage signal on the data line D.

Referring to FIG. 11 and FIG. 12, the first transistor T1 includes a first electrode SW11 (such as a drain electrode) and a second electrode SW12 (such as a source electrode). The second transistor T2 includes a first electrode SW21 (such as a drain electrode) and a second electrode SW22 (such as a source electrode). The peek-proof electrode E2 is electrically connected to the first electrode SW11 of the first transistor T1. The pixel electrode E1 is electrically connected to the first electrode SW21 of the second transistor T2.

In an embodiment of the present disclosure, referring to FIG. 11 and FIG. 12, when the peek-proof electrode E2 is electrically connected to the first data line D1 through the first switch SW1 and the pixel electrode E1 is electrically connected to the second data line D2 through the second switch SW2, the second electrode SW12 of the first transistor T1 is electrically connected to the first data line D1 and the second electrode SW22 of the second transistor T2 is electrically connected to the second data line D2.

In an embodiment of the present disclosure, referring to FIG. 9 and FIG. 10, in a case that at least one of the peek-proof electrodes E2 and the pixel electrode E1 adjacent to the peek-proof electrode E2 are respectively electrically connected to a same data line D through the first switch SW1 and the second switch SW2, at least one of the peek-proof electrodes E2 and the pixel electrode E1 adjacent to the peek-proof electrodes E2 are respectively electrically connected to the first electrode SW11 of the first transistor T1 and the first electrode SW21 of the second transistor T2, and the second electrode SW12 of the first transistor T1 and the second electrode SW22 of the second transistor T2 are reused as one electrode and electrically connected to a same data line D. That is, the peek-proof electrode E2 and the pixel electrode E1 sharing the data line D are respectively electrically connected to the data line D through the first transistor T1 and the second transistor T2, and the second electrode SW12 of the first transistor T1 and the second electrode SW22 of the second transistor T2 are reused as one electrode.

The second electrode SW12 of the first transistor T1 and the second electrode SW22 of the second transistor T2 are reused as one electrode and electrically connected to a same data line D, thereby reducing a space occupied by the first transistor T1 and the second transistor T2.

As shown in FIG. 9 to FIG. 12, the second transistor T2 may be a double-gate structure. This can quickly and accurately charge the pixel electrode E1, reduces a leakage current of the second transistor T2, ensures accuracy and stability of the voltage signal on the pixel electrode E1, and improves the display effect.

Referring to FIG. 1 and FIG. 2, with low requirements on accuracy and stability of the voltage signal on the peek-proof electrode E2, the first transistor T1 may be a single-gate structure. Therefore, the space occupied by the first transistor T1 is small, and the first transistor T1 has less influence on other structures in the display panel.

In an embodiment of the present disclosure, referring to FIG. 1, FIG. 6 to FIG. 8 and FIG. 11, the display panel 10 further includes a first scanning line S1 and a second scanning line S2. A control terminal of the first switch SW1 is electrically connected to the first scanning line S1, and a control terminal of the second switch SW2 is electrically connected to the second scanning line S2. An on/off state of the first switch SW1 may be controlled by a signal transmitted by the first scanning line S1. An on/off state of the second switch SW2 may be controlled by a signal transmitted by the second scanning line. When the first switch SW1 includes the first transistor T1 and the second switch SW2 includes the second transistor T2, the first scanning line S1 may be electrically connected to a gate of the first transistor T1, and the second scanning line S2 may be electrically connected to a gate of the second transistor T2.

When the first transistor T1 and the second transistor T2 are respectively controlled to be turned on by the first scanning line S1 and the second scanning line S2, the display panel 10 enters the peek-proof mode. When the first transistor T1 is controlled to be turned off by the first scanning line S1 and the second transistor T2 is controlled to be turned on by the second scanning line S2, the display panel 10 enters the non-peek-proof mode. In an embodiment of the present disclosure, the first switch SW1 and the second switch SW2 are respectively controlled by a signal transmitted by the first scanning line S1 and a signal transmitted by the second scanning line S2, such that the peek-proof mode of the display panel 10 can be entered more flexibly.

For example, in response to the peek-proof mode of the display panel 10, the first transistor T1 is controlled to be turned on by the first scanning line S1 and the second transistor T2 is controlled to be turned on by the second scanning line S2, the first switch SW1 and the second switch SW2 are turned on, and the peek-proof electrode E2 and the pixel electrode E1 each receive a voltage signal transmitted by the data line D. For example, in response to the non-peek-proof mode of the display panel 10, the first transistor T1 is controlled to be turned off by the first scanning line S1 and the second transistor T2 is controlled to be turned on by the second scanning line S2, the first switch SW1 is turned off and the second switch SW2 is turned on, and the peek-proof electrode E2 receives a voltage signal transmitted by the data line D and the pixel electrode E1 does not receive a voltage signal transmitted by the data line D.

In an embodiment of the present disclosure, as shown in FIG. 9 and FIG. 11, along the direction Z perpendicular to the plane of the display panel 10, the first scanning line S1 does not overlap with the second switch SW2, and the second scanning line S2 does not overlap with the first switch SW1. That is, the first scanning line S1 electrically connected to the first switch SW1 does not overlap with the second switch SW2 in the direction Z perpendicular to the plane of the display panel 10, and the second scanning line S2 electrically connected to the second switch SW2 does not overlap with the first switch SW1 in the direction Z perpendicular to the plane of the display panel 10.

When the first switch SW1 includes the first transistor T1 and the second switch SW2 includes the second transistor T2, the first scanning line S1 does not overlap with the second transistor T2 in the direction Z perpendicular to the plane of the display panel 10, and the second scanning line S2 does not overlap with the first transistor T1 in the direction Z perpendicular to the plane of the display panel 10.

When the transistor overlaps with the scanning line that is electrically insulated from the transistor, the signal on the scanning line causes interference with the transistor that overlaps with the scanning line and is not connected to the scanning line. Then, a signal output by the transistor is changed to cause abnormal display of the display panel 10. In the embodiments of the present disclosure, the second scanning line S2 does not overlap with the first transistor T1. This can reduce influences of the second scanning line S2 on the first transistor T1, and ensures that the peek-proof electrode E2 can receive an effective voltage signal and the signal on the peek-proof electrode E2 is stable. Likewise, the first scanning line S1 does not overlap with the second transistor T2. This can reduce influences of the first scanning line S1 on the second transistor T2, and ensures that the pixel electrode can receive an effective voltage signal and the signal on the pixel electrode E1 is stable.

In an embodiment of the present disclosure, referring to FIG. 1, FIG. 6 to FIG. 8 and FIG. 11, the display panel 10 further includes a data line D. An extension direction of the first scanning line S1 is the same as an extension direction of a main body of the data line D. That is, the extension direction of the first scanning line S1 is approximately the same as an extension direction of the data line D. An extension direction of the second scanning line S2 is intersected with the extension direction of the first scanning line S1. That is, the extension direction of the first scanning line S1 is intersected with the extension direction of the second scanning line S2.

The extension direction of the first scanning line S1 is different from the extension direction of the second scanning line S2, such that the two scanning lines are adapted for transistors in different design configurations, and overlap with a channel of the first transistor T1 and a channel of the second transistor T2 in different designed manners, thereby controlling the first transistor T1 and the second transistor T2.

In an embodiment of the present disclosure, referring to FIG. 1, FIG. 6 to FIG. 8 and FIG. 11, along the direction Z perpendicular to the plane of the display panel, the first scanning line S1 overlaps with the data line D. A main portion of the first scanning line S1 may overlap with the data line D. By overlapping the first scanning line S1 with the data line D, the first scanning line S1 cannot occupy an excessive space in the first direction X. It can be understood that a portion of the first scanning line S1 overlapping with the data line D and the data line D may be located on different conductive film layers.

Figure 13:
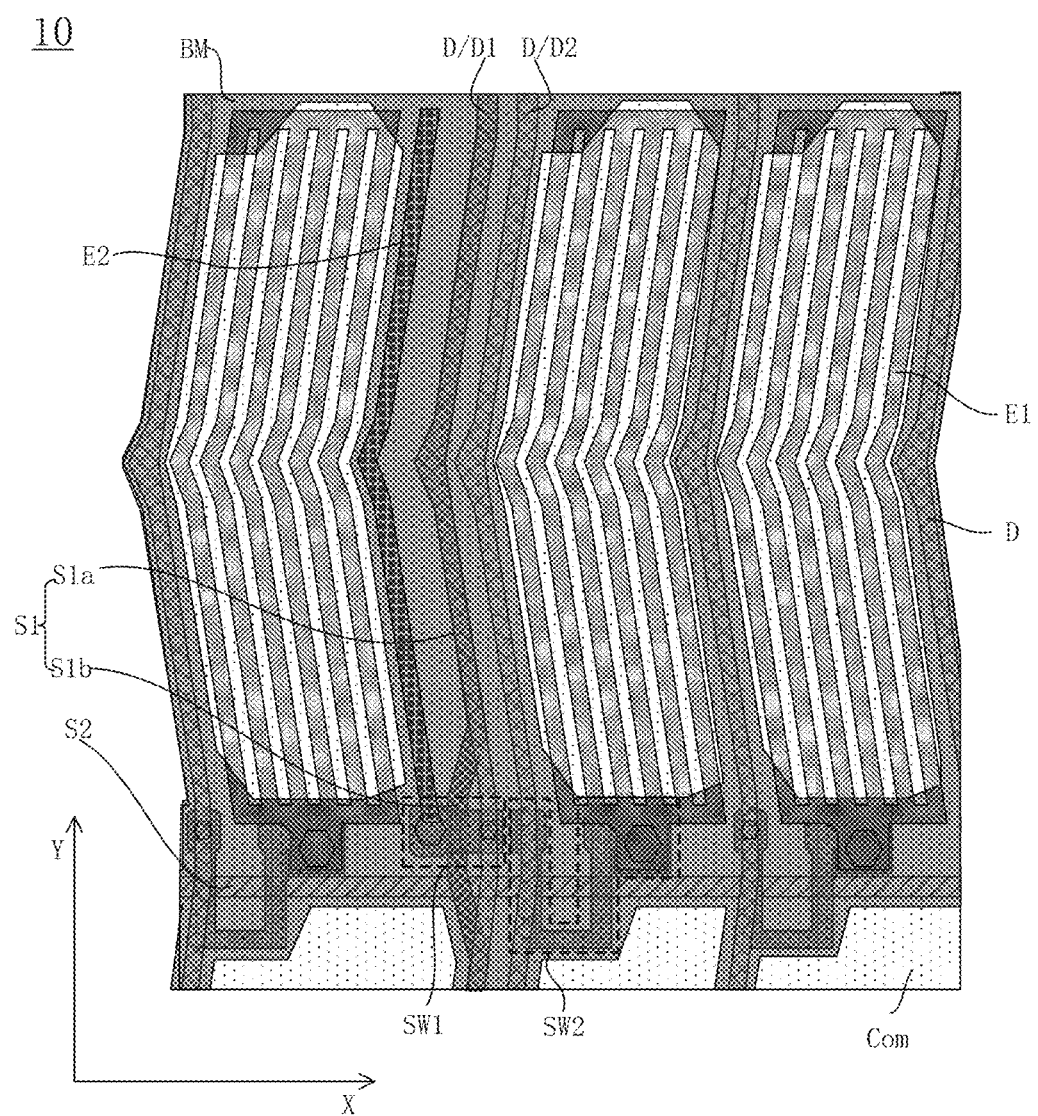
FIG. 13 is a schematic partial view of a display panel according to an embodiment of the present disclosure.

FIG. 13 is a schematic partial view of a display panel according to an embodiment of the present disclosure.

In an embodiment of the present disclosure, as shown in FIG. 13, the first scanning line S1 includes a main portion Sla and a protrusion S1b that are electrically connected to each other. Along the direction Z perpendicular to the plane of the display panel 10, the main portion Sla at least partially overlaps with the data line S, and the protrusion S1b overlaps with the first switch SW1. That is, the first scanning line S1 approximately extends along the extension direction of the data line D, and is deflected toward the first switch SW1 when being adjacent to the first switch SW1, to realize electrical connection with the control terminal of the first switch SW1, for example, to realize electrical connection with the gate of the first transistor T1. For example, as shown in FIG. 11, along the direction Z perpendicular to the plane of the display panel 10, the main portion S1a of the first scanning line S1 overlaps with the main portion of the data line D, and the protrusion S1b overlaps with the first switch SW1 but does not overlap with the data line D.

In the embodiments of the present disclosure, the main portion Sla of the first scanning line S1 at least partially overlaps with the data line D, thereby simplifying wiring in the display panel 10. The protrusion S1b overlaps with the first switch SW1 but does not overlap with the data line D, thereby realizing control of the first scanning line S1 on the first transistor T1 and reducing interference of the data line D on the first scanning line S1.

Figure 14:
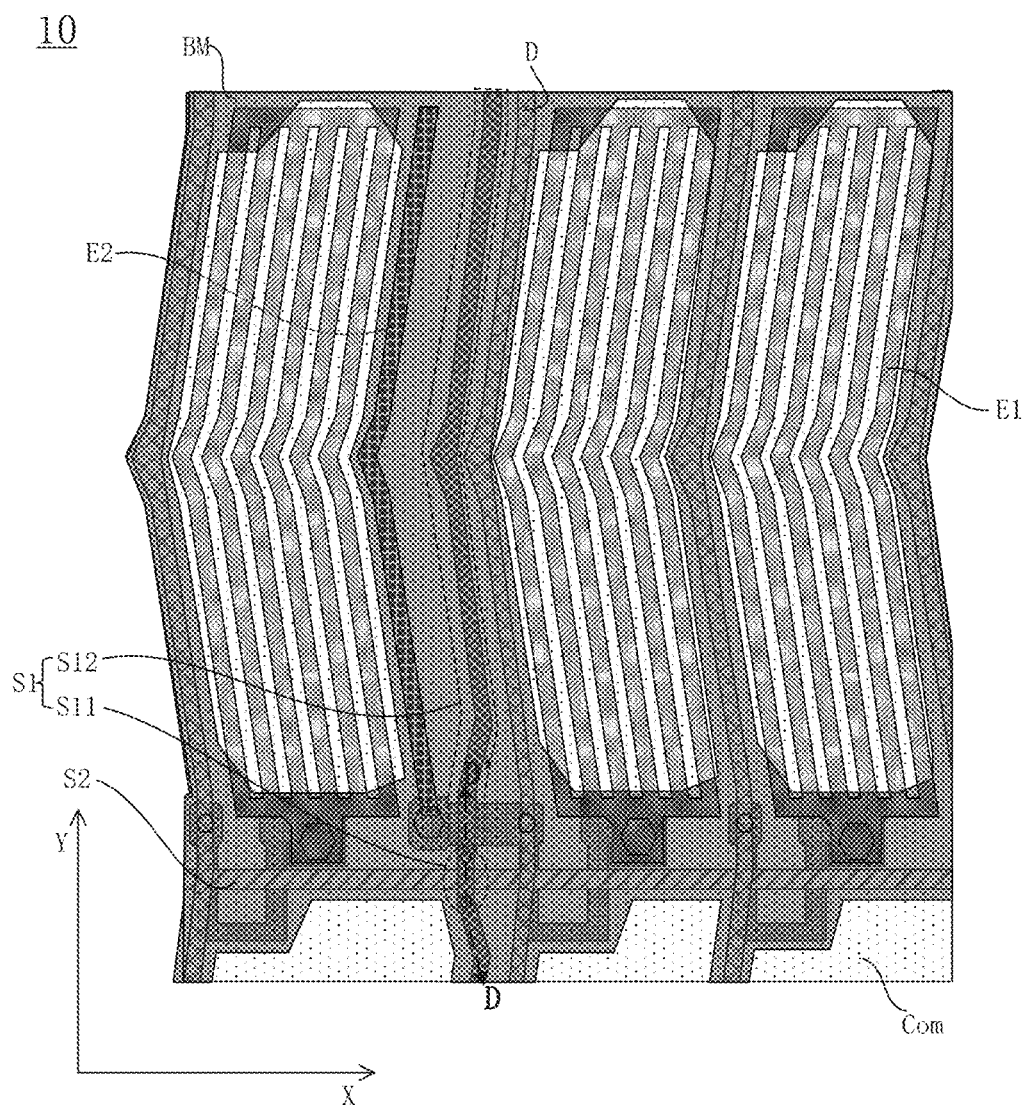
FIG. 14 is a schematic partial view of a display panel according to an embodiment of the present disclosure.

FIG. 14 is a schematic partial view of a display panel according to an embodiment of the present disclosure.

In an embodiment of the present disclosure, as shown in FIG. 14, along the direction Z perpendicular to the plane of the display panel 10, the first scanning line S1 does not overlap with the data line D.

In the embodiments of the present disclosure, a projection of the first scanning line S1 on the plane of the display panel 10 does not overlap with a projection of the data line D on the plane of the display panel 10, thereby reducing a coupling capacitance between the data line D and the first scanning line S1, and thus reducing interference of the data line D on a signal transmitted by the first scanning line S1. In this case, in the peek-proof mode, the first scanning line S1 transmits a stable enable signal to control the first transistor T1 to be turned on, and the peek-proof electrode E2 receives a stable driving voltage. While maintaining the peek-proof efficiency, this improves the peek-proof display effect during display.

Figure 15:
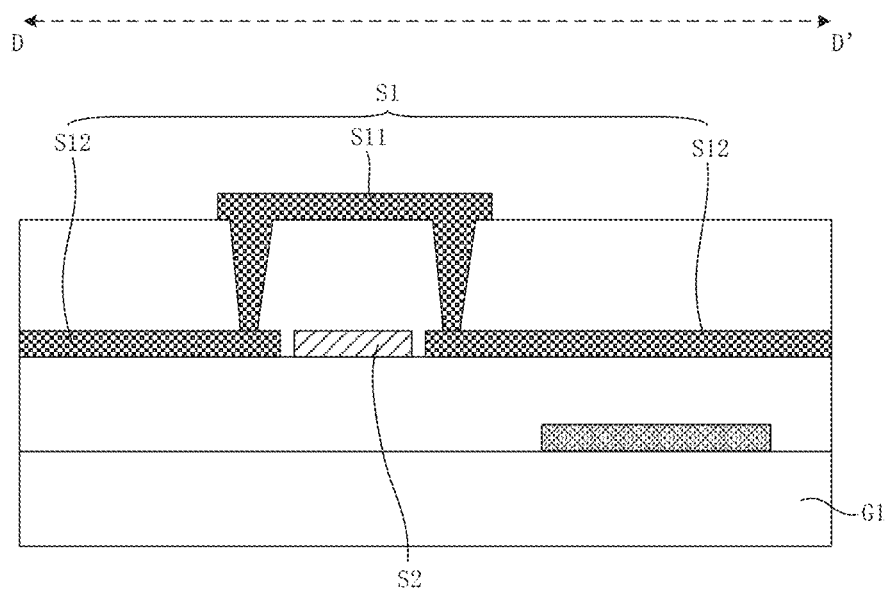
FIG. 15 is a schematic sectional view of a first scanning line along DD' shown in FIG. 14 according to an embodiment of the present disclosure.

FIG. 15 is a schematic sectional view of a first scanning line along DD' shown in FIG. 14.

In an embodiment of the present disclosure, referring to FIG. 14 and FIG. 15, when the extension direction of the first scanning line S1 is intersected with the extension direction of the second scanning line S2, the first scanning line S1 includes a first portion S11 and a second portion S12 that are electrically connected to each other. Along the direction Z perpendicular to the plane of the display panel 10, the first portion S11 overlaps with the second scanning line S2 and the second portion S12 does not overlap with the second scanning line S2. The first portion S11 and the second scanning line S2 are provided on different layers, and the second portion S12 and the second scanning line S2 are provided on a same layer. That is, a portion of the first scanning line S1 not overlapping with the second scanning line S2 and the second scanning line S2 are located on a same conductive film layer. In this case, a portion of the first scanning line S1 overlapping with the second scanning line S2 is formed in a jumper wire manner, to prevent crossing between the first scanning line S1 and the second scanning line S2 to cause a short circuit.

Figure 16:
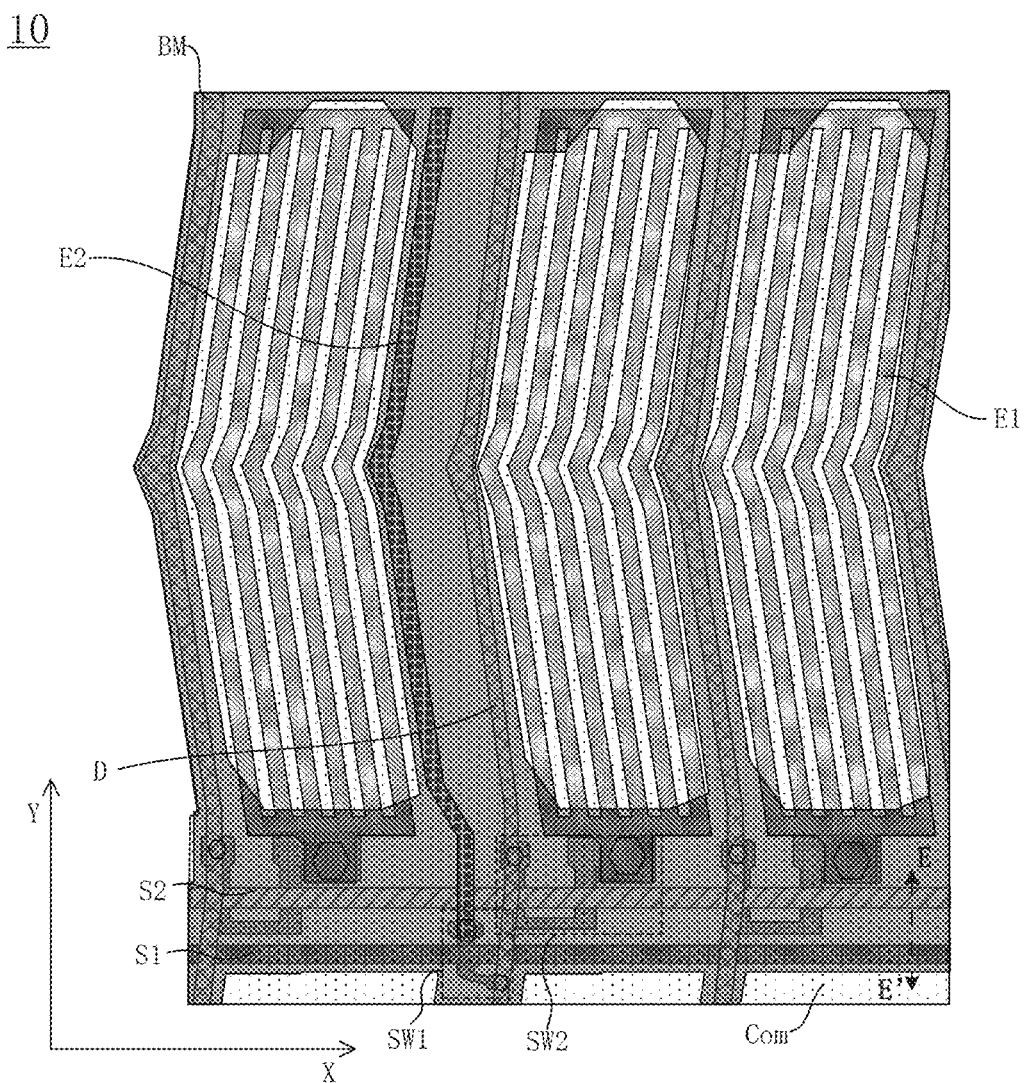
FIG. 16 is a schematic partial view of a display panel according to an embodiment of the present disclosure.

FIG. 16 is a schematic partial view of a display panel according to an embodiment of the present disclosure.

In an embodiment of the present disclosure, as shown in FIG. 15, the extension direction of the first scanning line S1 is parallel to the extension direction of the second scanning line S2. Along the direction Z perpendicular to the plane of the display panel 10, the first scanning line S1 does not overlap with the second scanning line S2. For example, as shown in FIG. 15, the first scanning line S1 and the second scanning line S2 each approximately extend along the first direction X.

In the embodiments of the present disclosure, by making the first scanning line S1 parallel to the second scanning line S2, wiring in the display panel 10 is simplified. Meanwhile, along the direction Z perpendicular to the plane of the display panel 10, the first scanning line S1 does not overlap with the second scanning line S2, thereby reducing a coupling interference between the first scanning line S1 and the second scanning line S2, and preventing error control of the second scanning line S2 on the first switch SW1 and error control of the first scanning line S1 on the second switch SW2.

Figure 17:
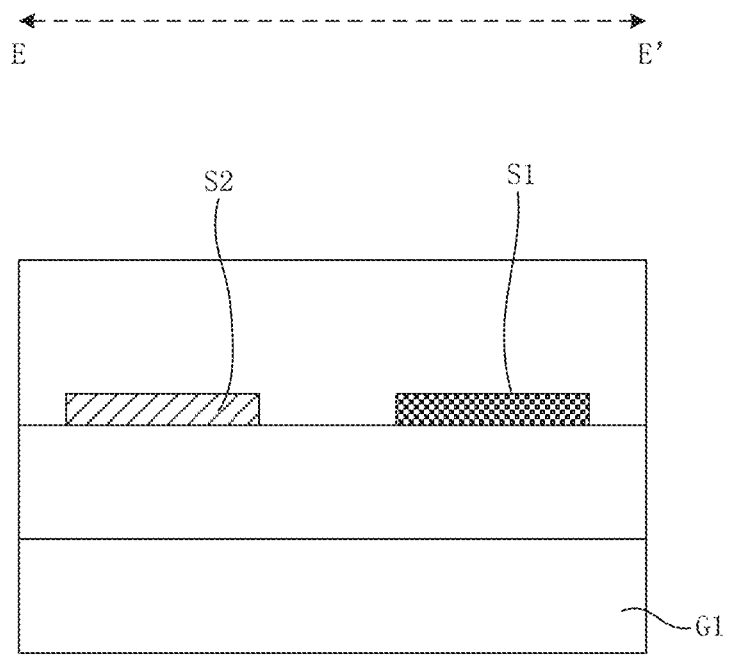
FIG. 17 is a schematic sectional view of a first scanning line along EE' shown in FIG. 16 according to an embodiment of the present disclosure.

FIG. 17 is a schematic sectional view of a first scanning line along EE' shown in FIG. 16.

In an embodiment, referring to FIG. 16 and FIG. 17, the first scanning line S1 and the second scanning line S2 in the display panel 10 are provided on a same layer. That is, a film layer of the first scanning line S1 is the same as a film layer of the second scanning line S2.

In the embodiments of the present disclosure, by providing the first scanning line S1 and the second scanning line S2 on the same layer, the display panel is thinner. Moreover, the first scanning line S1 and the second scanning line S2 can be formed in a same process, thereby saving a cost and shortening a preparation period.

Figure 18:
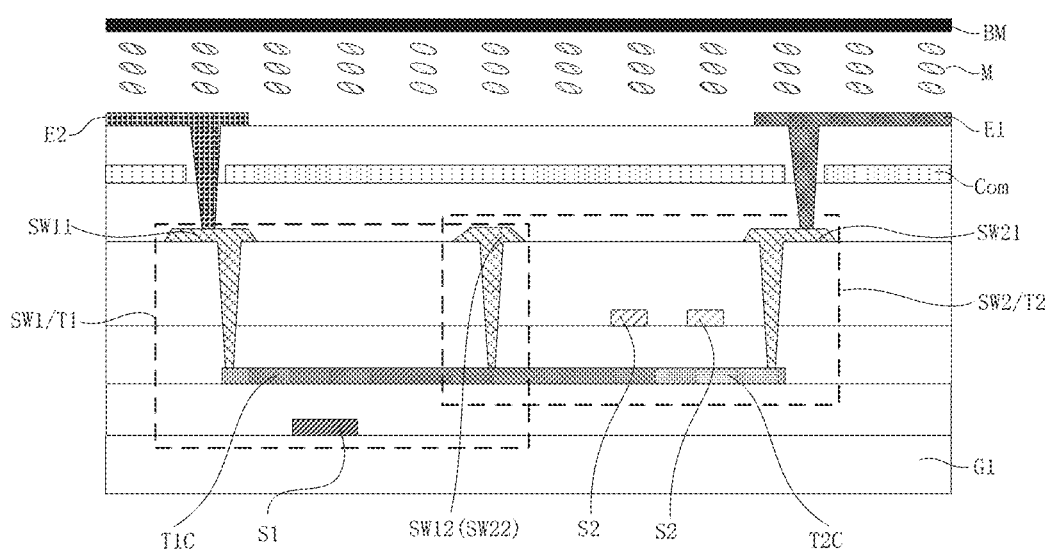
FIG. 18 is a schematic partial sectional view of a display panel according to an embodiment of the present disclosure.
Figure 19:
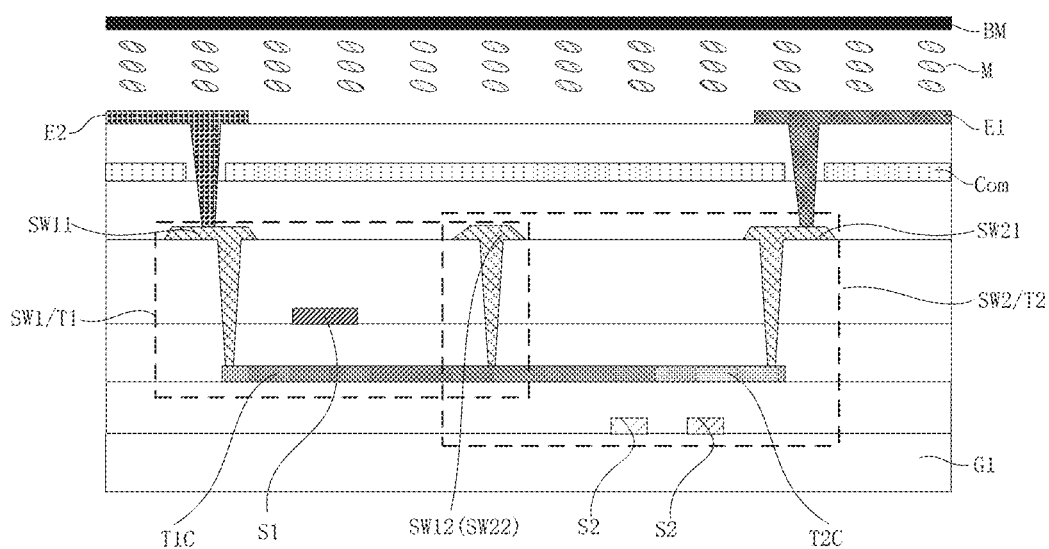
FIG. 19 is a schematic partial sectional view of a display panel according to an embodiment of the present disclosure.

FIG. 18 is a schematic partial sectional view of a display panel according to an embodiment of the present disclosure.
FIG. 19 is a schematic partial sectional view of a display panel according to an embodiment of the present disclosure.

In an embodiment of the present disclosure, the first scanning line S1 and the second scanning line S2 may be provided on different layers. As shown in FIG. 18 and FIG. 19, a film layer of a semiconductor layer T1C of the first transistor T1 and a semiconductor layer T2C of the second transistor T2 may be located between the film layer of the first scanning line S1 and the film layer of the second scanning line S2. One of the first transistor T1 and the second transistor T2 may be a bottom gate structure, while the other one of the first transistor T1 and the second transistor T2 may be a top gate structure. The semiconductor layer T2C of the second transistor T2 may be provided on a same layer with the semiconductor layer T1C of the first transistor T1.

In an implementation, as shown in FIG. 18, the first scanning line S1 is located at a side of the semiconductor layer T1C of the first transistor T1 away from the light exit surface of the display panel, and the second scanning line S2 is located at a side of the semiconductor layer T2C of the second transistor T2 adjacent to the light exit surface of the display panel. That is, the first transistor T1 may be the bottom gate structure, and the second transistor T2 may be the top gate structure.

In an implementation, as shown in FIG. 19, the first scanning line S1 is located at a side of the semiconductor layer T1C of the first transistor T1 close to the light exit surface of the display panel, and the second scanning line S2 is located at a side of the semiconductor layer T2C of the second transistor T2 away from the light exit surface of the display panel. That is, the first transistor T1 may be the top gate structure, and the second transistor T2 may be the bottom gate structure.

In the embodiments of the present disclosure, the first scanning line S1 and the second scanning line S2 have no risk of a short circuit, and can be flexibly provided according to a position of a trench of the first transistor T1 and a position of a trench of the second transistor T2.

In the embodiments of the present disclosure, when the extension direction of the first scanning line S1 and the extension direction of the main body of the data line D are parallel to each other, and for example the two overlap each other along the direction Z perpendicular to the plane of the display panel for example, the first scanning line S1 may be provided at a side of the film layer of the second scanning line S1 away from the film layer of the data line D. in this way, the signal interference between the first scanning line S1 and the data line can be reduced.

In the embodiments of the present disclosure, when the extension direction of the first scanning line S1 is parallel to the extension direction of the second scanning line S2, a distance between the first scanning line S1 and the second scanning line S2 may be greater along the direction Z perpendicular to the plane of the display panel, so as to reduce the signal interference therebetween.

Figure 20:
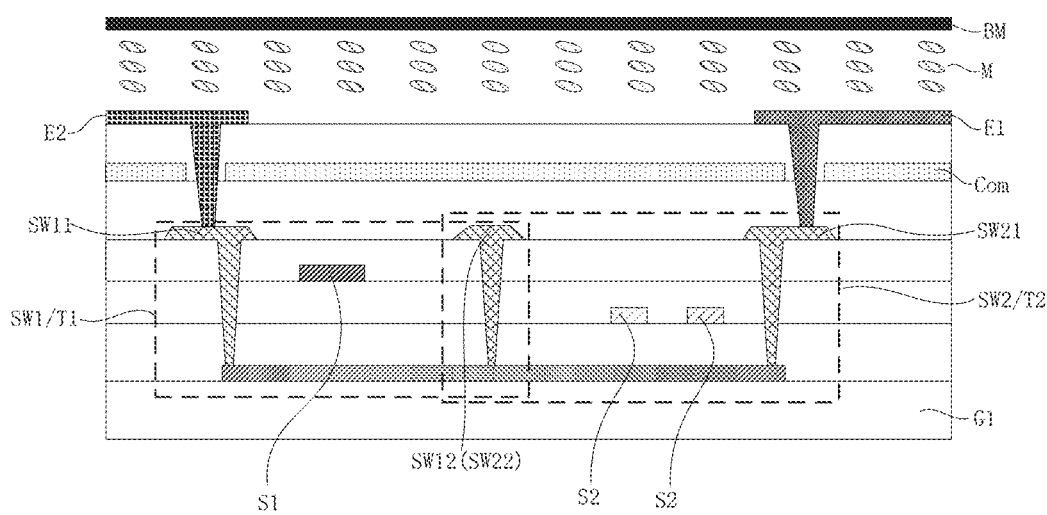
FIG. 20 is a schematic partial sectional view of a display panel according to an embodiment of the present disclosure.
Figure 21:
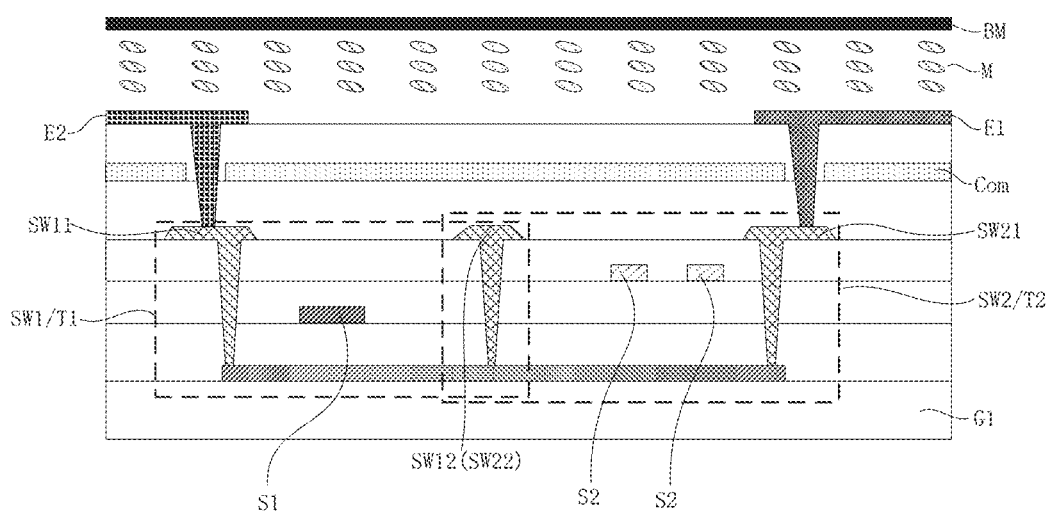
FIG. 21 is a schematic partial sectional view of a display panel according to an embodiment of the present disclosure.

FIG. 20 is a schematic partial sectional view of a display panel according to an embodiment of the present disclosure. FIG. 21 is a schematic partial sectional view of a display panel according to an embodiment of the present disclosure.

In an embodiment of the present disclosure, referring to FIG. 20 and FIG. 21, the display panel 10 further includes a data line D. The data line D, the first scanning line S1 and the second scanning line S2 may be provided on different layers. The film layer of the first scanning line S1 and the film layer of the second scanning line S2 may be located at a same side of a film layer of the data line D.

In an embodiment, as shown in FIG. 20, the film layer of the first scanning line S1 is located between the film layer of the second scanning line S2 and the film layer of the data line D.

In an implementation, as shown in FIG. 21, the film layer of the second scanning line S2 is located between the film layer of the first scanning line S1 and the film layer of the data line D.

In the embodiments of the present disclosure, when the film layer of the first scanning line S1 and the film layer of the second scanning line S2 are located at a same side of the film layer of the data line D, a distance between the first scanning line S1 and a trench of the first transistor T1 in the direction Z perpendicular to the plane of the display panel is approximate to a distance between the second scanning line S2 and a trench of the second transistor T2 in the direction Z perpendicular to the plane of the display panel, thereby effectively controlling the first transistor T1 and the second transistor T2.

In an embodiment, as shown in FIG. 20 and FIG. 21, the film layer of the first scanning line S1 and the film layer of the second scanning line S2 are located at a side of the film layer of the data line D adjacent to the semiconductor layer T1C of the first transistor T1 and the semiconductor layer T2C of the second transistor T2.

Figure 22:
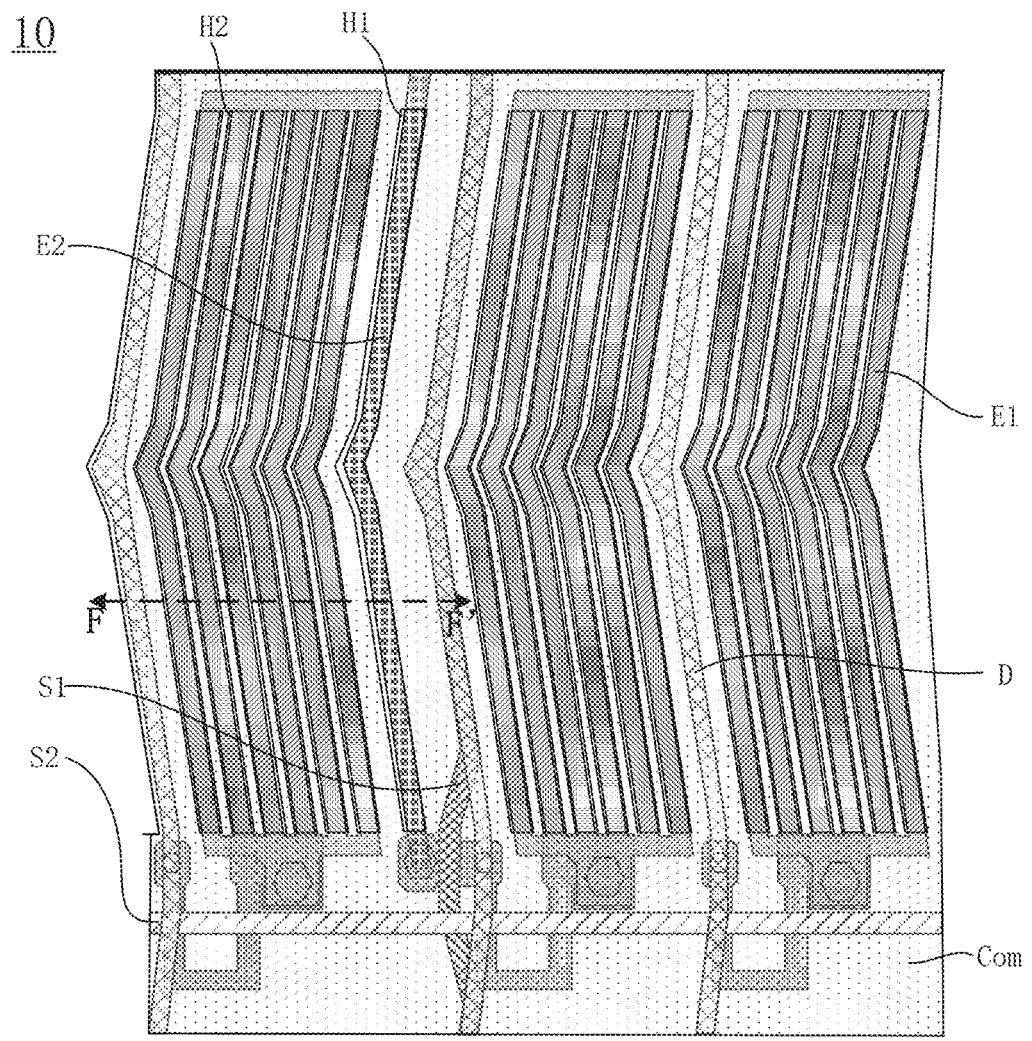
FIG. 22 is a schematic partial view of a display panel according to an embodiment of the present disclosure.
Figure 23:
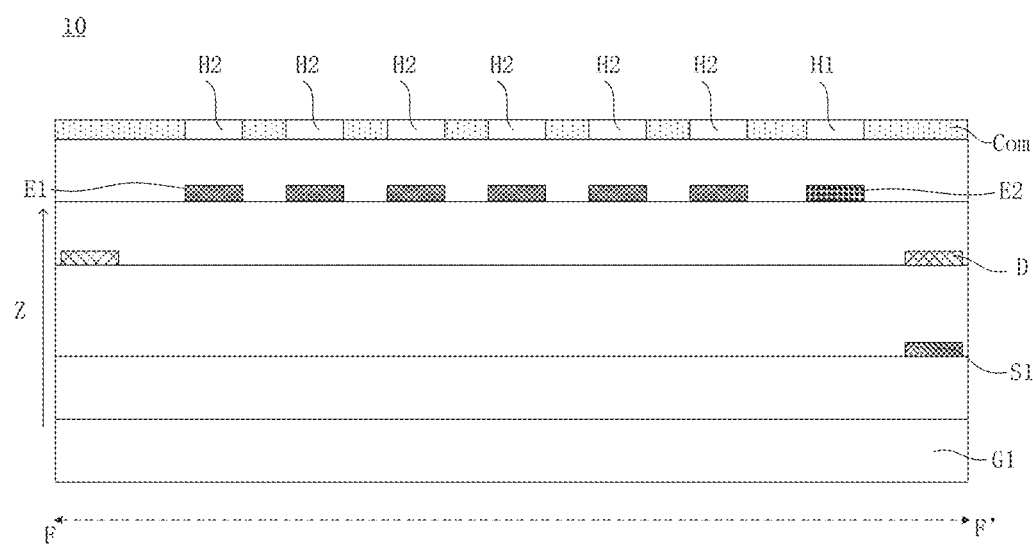
FIG. 23 is a schematic sectional view along FF' shown in FIG. 22 according to an embodiment of the present disclosure.

FIG. 22 is a schematic partial view of a display panel according to an embodiment of the present disclosure. FIG. 23 is a schematic sectional view along FF' shown in FIG. 22. For clarity, some structures in the display panel are omitted in FIG. 22 and FIG. 23. For example, the light-shielding structural layer and the display dielectric layer are omitted.

In an embodiment of the present disclosure, referring to FIG. 22 and FIG. 23, the display panel 10 further includes a common electrode Com. Along the direction Z perpendicular to the plane of the display panel 10, the common electrode Com overlaps with at least two of the pixel electrodes E1. That is, the common electrode Com overlapping with at least two sub-pixels provides a common voltage, and pixel electrodes E1 in the at least two sub-pixels can provide independent pixel voltages, respectively.

In addition, along the direction Z perpendicular to the plane of the display panel 10, the common electrode Com may further overlap with the peek-proof electrode E1. Electric fields are formed between the common electrode Com and the pixel electrode E1, and between the common electrode Com and the peek-proof electrode E2 to control a state of the display dielectric layer M, thereby making a transmittance of the display light controllable.

The common electrode Com may be located at a side of the pixel electrode E1 away from the light exit surface of the display panel 10. The common electrode Com may also be located at a side of the pixel electrode E1 adjacent to the light exit surface of the display panel 10. The common electrode Com may be located at a side of the peek-proof electrode E2 away from the light exit surface of the display panel 10. The common electrode Com may also be located at a side of the peek-proof electrode E2 adjacent to the light exit surface of the display panel 10.

In addition, the peek-proof electrode E2 and the pixel electrode E1 may be located at a same side of the common electrode Com, or may be located at different sides of the common electrode Com. For example, the peek-proof electrode E2 may be located at a side of the common electrode adjacent to the light exit surface of the display panel 10, and the pixel electrode E1 may be located at a side of the common electrode away from the light exit surface of the display panel 10. For example, the pixel electrode E1 may be located at a side of the common electrode adjacent to the light exit surface of the display panel 10, and the peek-proof electrode E2 may be located at a side of the common electrode away from the light exit surface of the display panel 10.

A slit structure is usually formed in the common electrode Com, particularly when the common electrode Com is located at a side of the pixel electrode E1 adjacent to the light exit surface of the display panel. When the common electrode is located at a side of the pixel electrode E1 and the peek-proof electrode E2 adjacent to the light exit surface of the display panel, if the common electrode Com is a continuous electrode without a slit structure, the common electrode Com shields the electric field between the pixel electrode E1 and the common electrode Com and the electric field between the peek-proof electrode E2 and the common electrode to a side of the common electrode Com away from the display dielectric layer M, such that the display dielectric layer M cannot be controlled.

Therefore, in the embodiments of the present disclosure, the common electrode Com includes a first slit H1. Along the direction Z perpendicular to the plane of the display panel, the first slit H1 overlaps with the peek-proof electrode E2. In this case, the electric field formed between the common electrode Com and the peek-proof electrode E2 can control the display dielectric layer M through the first slit H1.

In addition, the common electrode Com may further include a second slit H2. Along the direction Z perpendicular to the plane of the display panel, the second slit H2 overlaps with the pixel electrode E1. In this case, the electric field formed between the common electrode Com and the pixel electrode E1 can control the display dielectric layer M through the second slit H2.

In an embodiment of the present disclosure, as shown in FIG. 14, along the direction Z perpendicular to the plane of the display panel 10, the peek-proof electrode E2 does not overlap with the data line D and does not overlap with the first scanning line S1, and the first scanning line S1 does not overlap with the data line D.

In the embodiments of the present disclosure, the peek-proof electrode E2 does not overlap with the data line D and does not overlap with the first scanning line S1, thereby reducing interference on the signal of the peek-proof electrode E2 from the data line D and the first scanning line S1, so that the peek-proof electrode E2 can maintain at a stable voltage signal, and it can prevent abnormal change to the brightness of the second display light L2, and thus improving the peek-proof display effect.

Figure 24:
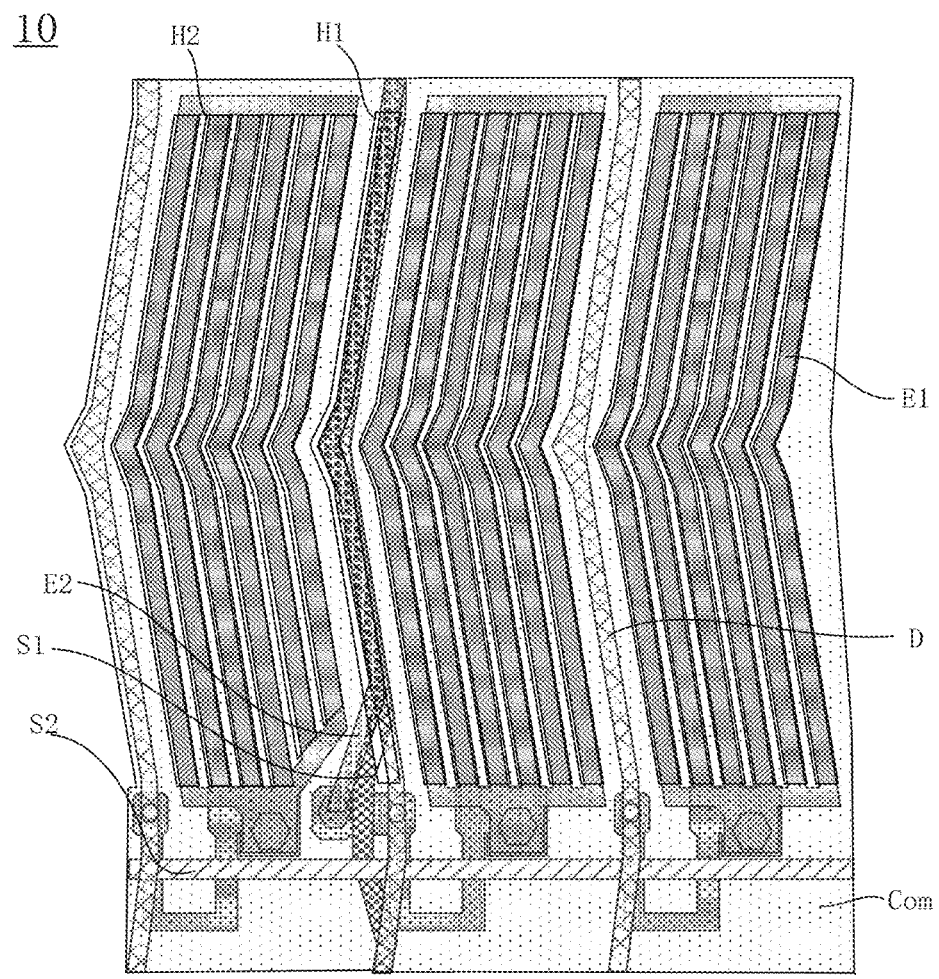
FIG. 24 is a schematic partial view of a display panel according to an embodiment of the present disclosure.

FIG. 24 is a schematic partial view of a display panel according to an embodiment of the present disclosure.

In an embodiment of the present disclosure, as shown in FIG. 24, along the direction Z perpendicular to the plane of the display panel 10, the peek-proof electrode E2 at least partially overlaps with the data line D and the first scanning line S1, such that the peek-proof electrode E2 cannot additionally occupy the space in the display panel. For example, as shown in FIG. 14, along the direction Z perpendicular to the plane of the display panel 10, the main portion of the peek-proof electrode E2 overlaps with the main portion of the data line D and the main portion of the first scanning line S1.

In the embodiments of the present disclosure, when the common electrode Com includes a first slit H1 overlapping with the peek-proof electrode E2, the first slit H1 also overlaps with at least one of the data line D and the first scanning line S. However, for a portion of the data line D and/or the first scanning line S overlapping with the first slit H1, a side of this portion adjacent to the display dielectric layer M is provided with the peek-proof electrode E2, and this portion of the data line D and/or the first scanning line S overlapping with the first slit H1 does not cause error control on the display dielectric layer M.

Figure 25:
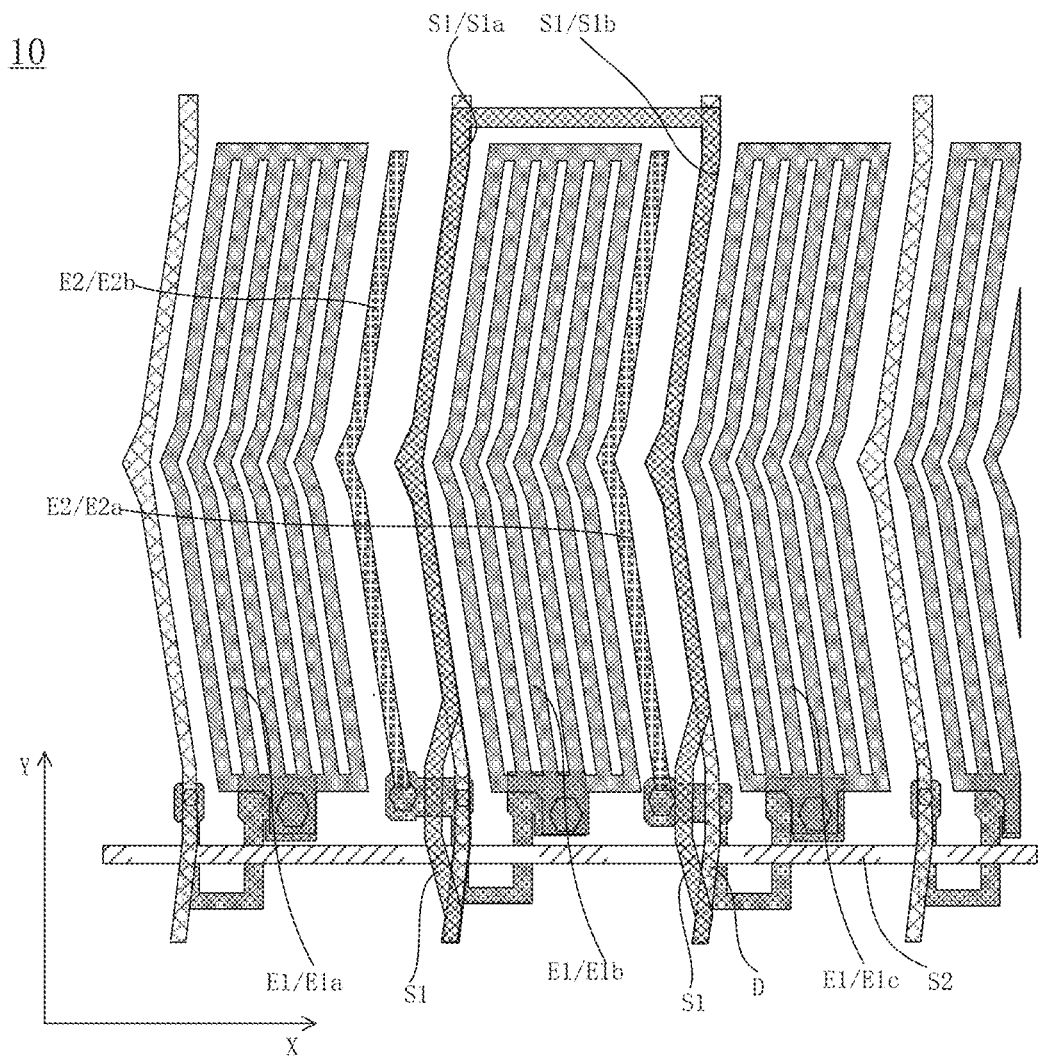
FIG. 25 is a schematic partial view of a display panel according to an embodiment of the present disclosure.

FIG. 25 is a schematic partial view of a display panel according to an embodiment of the present disclosure. For clarity, some structures in the display panel are omitted in FIG. 25. For example, the light-shielding structural layer and the display dielectric layer are omitted.

In an embodiment of the present disclosure, as shown in FIG. 25, the display panel 10 includes first scanning lines S1. At least some of the first scanning lines S1 are electrically connected with each other. In this case, the first switches SW1 electrically connected to these first scanning lines S1 may be simultaneously turned on to provide voltage signals to the peek-proof electrodes E1. Thus, at least some of the peek-proof electrodes E2 may start to work at the same time, that is, regions of these peek-proof electrodes E2 can realize the peek-proof display at the same time.

For example, as shown in FIG. 25, the first scanning line S1a is configured to control the first peek-proof electrode E2a to work, the first scanning line S1b is configured to control the second peek-proof electrode E2b to work, and the first scanning line S1a and the first scanning line S1b are electrically connected. The first peek-proof electrode E2a and the second peek-proof electrode E2b may start to work at the same time, so that regions of the first pixel electrode E1a and the second pixel electrode E1b can realize the peek prevention at the same time.

In addition, the first scanning lines S1 are at least partially electrically connected. This can further reduce a driving difficulty of the first scanning lines S1, and reduce a number of peripheral wires and/or peripheral circuits electrically connected to the first scanning lines S1 in a bezel region of the display panel 10, to realize narrow-bezel display.

In an embodiment, the first scanning lines S1 are all electrically connected. In this case, all regions provided with the peek-proof electrodes E2 can realize the peek prevention at the same time.

Figure 26:
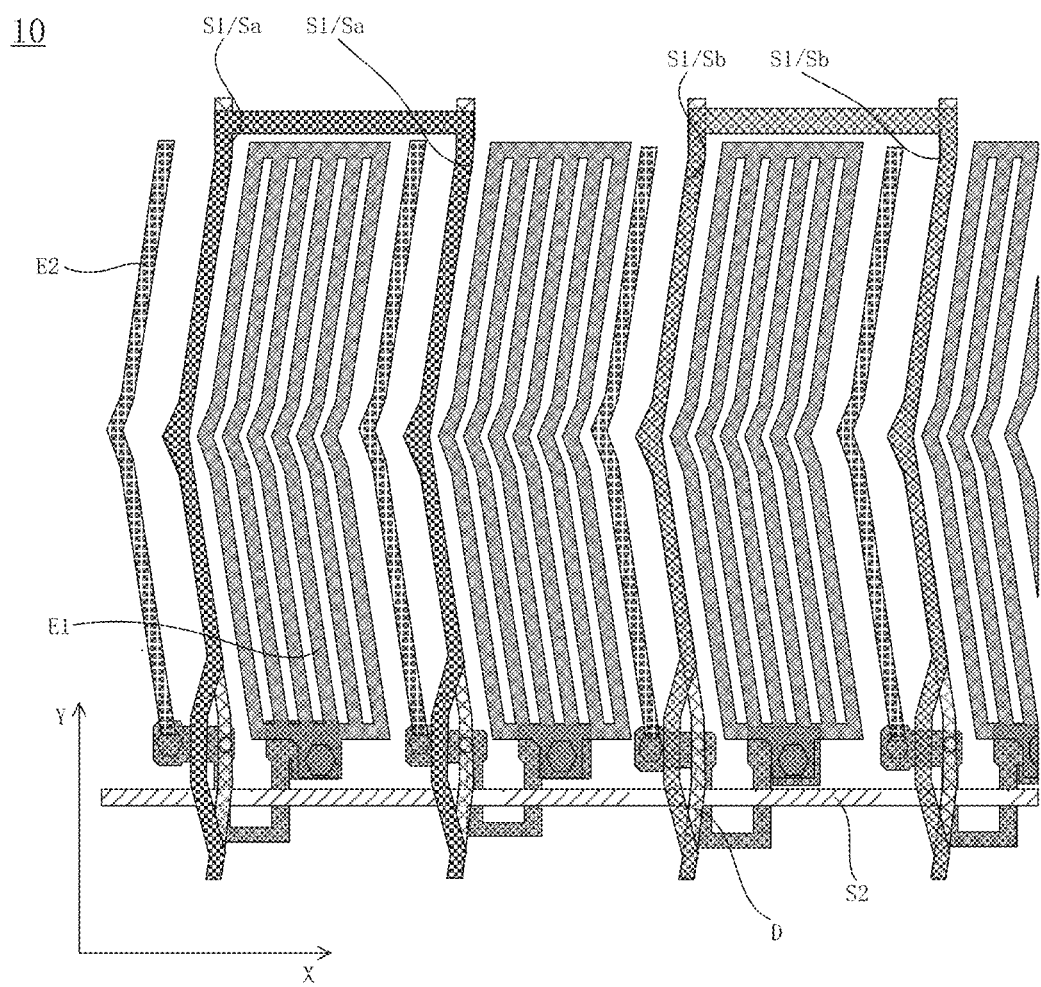
FIG. 26 is a schematic partial view of a display panel according to an embodiment of the present disclosure.

FIG. 26 is a schematic partial view of a display panel according to an embodiment of the present disclosure.

In an embodiment, as shown in FIG. 26, the first scanning lines S1 in the display panel 10 include a first scanning sub-line Sa and a second scanning sub-line Sb. That is, at least one of the first scanning lines S1 is the first scanning sub-line Sa, and at least another one of the first scanning lines S1 is the second scanning sub-line Sb. The first scanning sub-line Sa and the second scanning sub-line Sb may be provided adjacently and alternately, or, a plurality of the first scanning sub-lines Sa are adjacently arranged in sequence and a plurality of the second scanning sub-lines Sb are adjacently arranged in sequence.

At least two of the first scanning sub-lines Sa are electrically connected, and least two of the second scanning sub-lines Sb are electrically connected. A plurality of the first scanning sub-lines Sa may be electrically connected, and a plurality of the second scanning sub-lines Sb may be electrically connected. In addition, the first scanning sub-line Sa is electrically insulated from the second scanning sub-line Sb.

In the embodiments of the present disclosure, at least two of the first scanning sub-lines Sa are electrically connected, and least two of the second scanning sub-lines Sb are electrically connected, such that some peek-proof electrodes E2 in the display panel 10 can work at the same time while some other peek-proof electrodes E2 can work at the same time.

In some embodiments of the present disclosure, some peek-proof electrodes E2 can work at the same time while some other peek-proof electrodes E2 do not work, thereby realizing partially peek prevention. In some other embodiments of the present disclosure, the peek-proof electrodes E2 in the display panel 10 can work at the same time. Therefore, in an aspect, the peek-proof electrodes E2 can be selected as required to save power consumption, and in another aspect, more flexible peek prevention can be realized.

In an embodiment of the present disclosure, the display panel 10 includes sub-pixels having different colors, including a green sub-pixel. As shown in FIG. 25, the pixel electrode E1 of the green sub-pixel is a green sub-pixel electrode E1b. In an embodiment of the present disclosure, the peek-proof electrode E2 is adjacent to the green sub-pixel electrode E1b.

For example, the sub-pixels having different colors further include a red sub-pixel and a blue sub-pixel. The pixel electrode E1 of the red sub-pixel is a red sub-pixel electrode E1a, and the pixel electrode E1 of the blue sub-pixel is a blue sub-pixel electrode E1c. As shown in FIG. 25, in the plane of the display panel 10, two peek-proof electrodes E2 are located at two sides of the green sub-pixel electrode E1b along the first direction X. Along the first direction X, the peek-proof electrode E2 may not be provided between adjacent red sub-pixel electrodes E1a and between adjacent blue sub-pixel electrodes E1c.

In the embodiments of the present disclosure, light emitted by the green sub-pixel Pg is recognized by human eyes more easily. With the peek-proof electrode E2 between the green sub-pixel and an adjacent sub-pixel, more green second display light L2 is generated, and the observer under the WVA observes interfering light more easily and therefore cannot distinguish a normal display image. Therefore, the technical solution in the embodiments is more beneficial for peek prevention.

Figure 27:
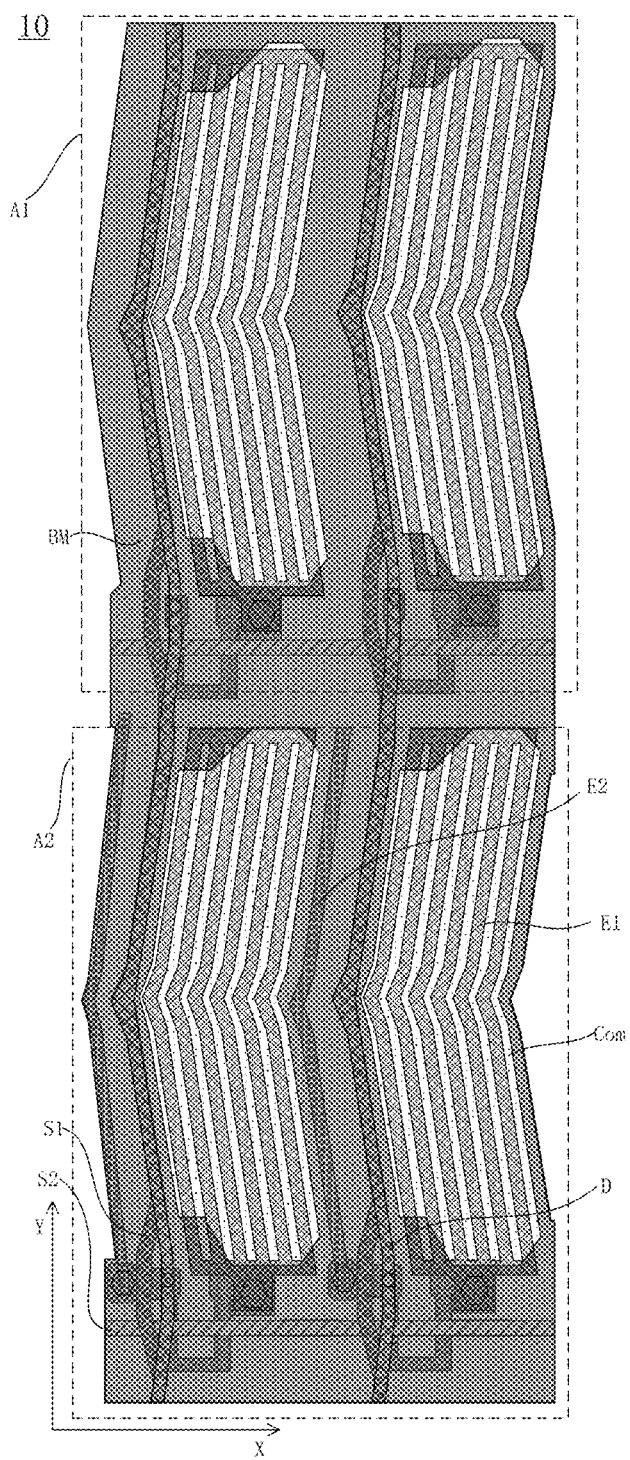
FIG. 27 is a schematic partial view of a display panel according to an embodiment of the present disclosure.

FIG. 27 is a schematic partial view of a display panel according to an embodiment of the present disclosure.

In an embodiment of the present disclosure, as shown in FIG. 27, the display panel 10 may include a first region A1 and a second region A2 according to distribution of the peek-proof electrodes E2. The first region A1 has the peek-proof function, while the second region A2 does not have the peek-proof function.

In an example, the first region A1 in the display panel 10 is provided with the pixel electrode E1, and the second region A2 in the display panel 10 is provided with both the pixel electrode E1 and the peek-proof electrode E2. The second region A2 may correspond to an edge region of the display panel 10.

In the embodiments of the present disclosure, with the first region A1 and the second region A2, the display panel 10 is divided into a peek-proof region and a non-peek-proof region to meet design requirements of peek-proof display in different cases. For example, a display image in the edge region of the display panel 10 is viewed more easily. Usually, the peek-proof electrode E2 is provided around the sub-pixel in the edge region of the display panel 10. The edge region corresponds to the second region A2. A display image in a central region of the display panel 10 is not peeked easily. In order to make the process less difficult, save a material cost and so on, the peek-proof electrode E2 may not be provided in the first region A1.

An embodiment of the present disclosure further provides a method for driving the display panel 10 described in any of the foregoing embodiments. The display mode of the display panel includes a first mode and a second mode. The method includes the following steps.

As shown in FIG. 2, in the first mode, the pixel electrode E1 and the peek-proof electrode E2 each receive a voltage signal, such that the display panel 10 achieves NVA display.

As shown in FIG. 3, in the second mode, the pixel electrode E1 receives a voltage signal and the peek-proof electrode E2 does not receive a voltage signal, such that the display panel 10 achieves WVA display.

By flexibly controlling whether the peek-proof electrode E2 receives a voltage signal, the method provided by the embodiments of the present disclosure can switch the display mode of the display panel between a peek-proof mode (first mode) and a non-peek-proof mode (second mode).

In an embodiment of the present disclosure, as shown in FIG. 1, the display panel 10 further includes a data line D, a first switch SW1, and a second switch SW2. At least one peek-proof electrode E2 and an adjacent pixel electrode E1 are respectively electrically connected to a same data line D through the first switch SW1 and the second switch SW2.

A method corresponding to this embodiment includes the following steps.

In the first mode, the data line D transmits a voltage signal, the first switch SW1 and the second switch SW2 are turned on, and the voltage signal transmitted on the data line D is transmitted to the peek-proof electrode E2 and the pixel electrode E1 through the first switch SW1 and the second switch SW2.

In the second mode, the data line D transmits a voltage signal. The first switch SW1 is turned off and the second switch SW2 is turned on. The voltage signal transmitted on the data line D is transmitted to the pixel electrode E1 through the second switch SW2.

Figure 28:
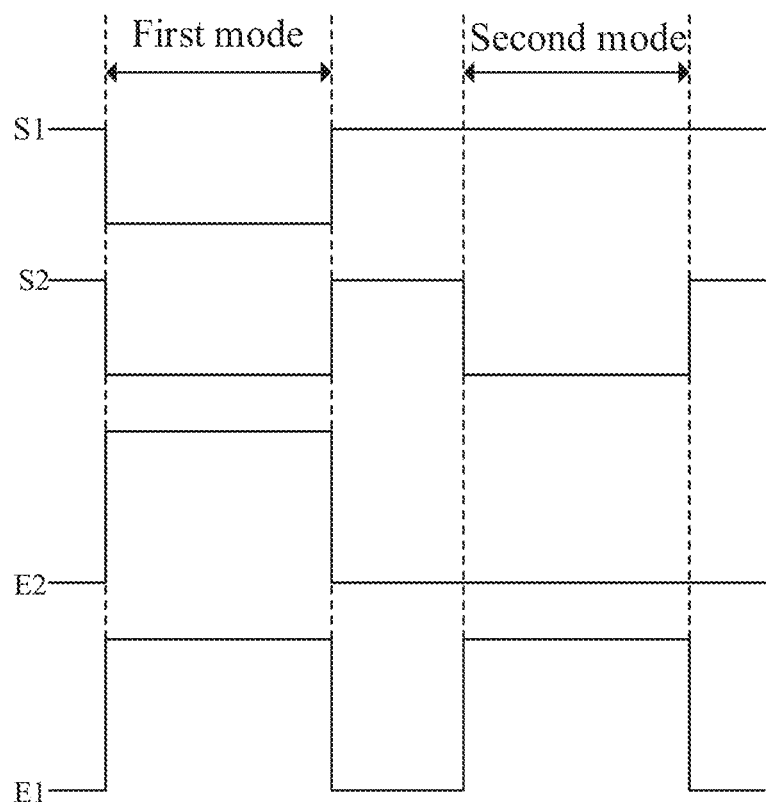
FIG. 28 illustrates a driving time sequence corresponding to a display panel shown in FIG. 1 according to an embodiment of the present disclosure.

FIG. 28 illustrates a driving time sequence corresponding to a display panel shown in FIG. 1.

Hereinafter, a case where the first switch SW1 includes a first transistor T1 and the second switch SW2 includes a second transistor T2, and the first transistor T1 and the second transistor T2 are both P-channel transistors is used as an example for description.

As shown in FIG. 28, in the first mode, the first scanning line S1 and the second scanning line S2 each transmit a low-level signal (enable signal) to turn on the first switch SW1 and the second switch SW2, the data line D transmits a voltage signal, and the peek-proof electrode E2 and the pixel electrode E1 each receive the voltage signal transmitted on the data line D.

As shown in FIG. 28, in the second mode, the first scanning line S1 transmits a high-level signal (disable signal) to turn off the first switch SW1, the second scanning line S2 transmits a low-level signal (enable signal) to turn on the second switch SW2, the data line D transmits a voltage signal, and the pixel electrode E1 receives the voltage signal transmitted on the data line D and the peek-proof electrode E2 cannot receive the voltage signal.

When the first transistor T1 and the second transistor T2 are both N-channel transistors, the method may include the following steps.

In the first mode, the first scanning line S1 and the second scanning line S2 each transmit a high-level signal (enable signal) to turn on the first switch SW1 and the second switch SW2, the data line D transmits a voltage signal, and the peek-proof electrode E2 and the pixel electrode E1 each receive the voltage signal transmitted on the data line D.

As shown in FIG. 28, in the second mode, the first scanning line S1 transmits a low-level signal (disable signal) to turn off the first switch SW1, the second scanning line S2 transmits a high-level signal (enable signal) to turn on the second switch SW2, the data line D transmits a voltage signal, and the pixel electrode E1 receives the voltage signal transmitted by the data line D and the peek-proof electrode E2 cannot receive the voltage signal.

In an embodiment of the present disclosure, as shown in FIG. 11, the display panel 10 further includes a first data line D1, a second data line D2, a first switch SW1, and a second switch SW2. The peek-proof electrode E2 is electrically connected to the first data line D1 through the first switch SW1, and the pixel electrode E1 is electrically connected to the second data line D2 through the second switch SW2.

A method corresponding to this embodiment includes the following steps.

In the first mode, the first data line D1 and the second data line D2 each transmit a voltage signal, the first switch SW1 and the second switch SW2 are turned on, the voltage signal transmitted on the first data line D1 is transmitted to the peek-proof electrode E2 through the first switch SW1, and the voltage signal transmitted on the second data line D2 is transmitted to the pixel electrode E1 through the second switch.

In the second mode, the first data line D1 stops transmitting the voltage signal and/or the first switch SW1 is turned off, the second data line D2 transmits the voltage signal and the second switch SW2 is turned on, and the voltage signal transmitted on the second data line D2 is transmitted to the pixel electrode E1 through the second switch SW2.

Figure 29:
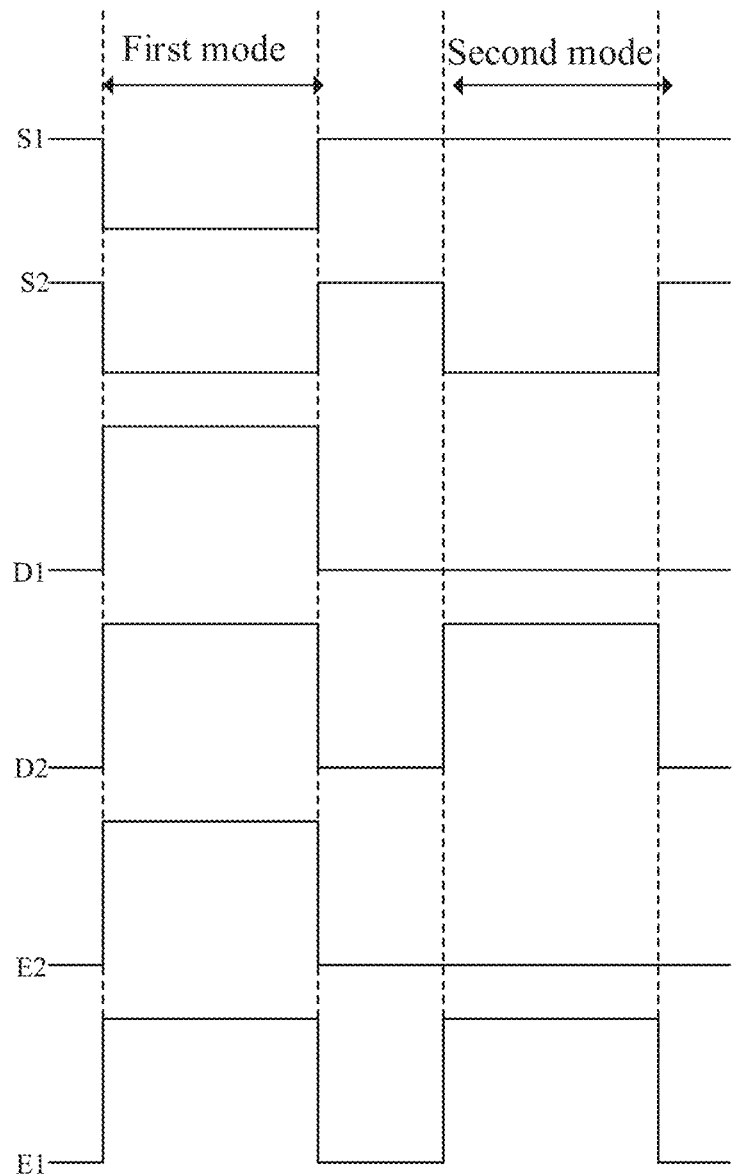
FIG. 29 illustrates a driving time sequence corresponding to a display panel shown in FIG. 1 according to an embodiment of the present disclosure.

FIG. 29 illustrates a driving time sequence corresponding to a display panel shown in FIG. 11.

Hereinafter, a case where the first switch SW1 includes a first transistor T1 and the second switch SW2 includes a second transistor T2, and the first transistor T1 and the second transistor T2 are both P-channel transistors is used as an example for description.

As shown in FIG. 29, in the first mode, the first scanning line S1 and the second scanning line S2 each transmit a low-level signal (enable signal) to turn on the first switch SW1 and the second switch SW2, the first data line D1 and the second data line D2 each transmit a voltage signal, and the peek-proof electrode E2 receives the voltage signal transmitted by the first data line D1 and the pixel electrode E1 receives the voltage signal transmitted by the second data line D2.

As shown in FIG. 29, in the second mode, the first scanning line S1 transmits a high-level signal (disable signal) to turn off the first switch SW1, the second scanning line S2 transmits a low-level signal (enable signal) to turn on the second switch SW2, the first data line D1 transmits a voltage signal and the second data line D2 does not transmit a voltage signal, and the pixel electrode E1 receives the voltage signal transmitted by the data line D and the peek-proof electrode E2 cannot receive the voltage signal.

When the first transistor T1 and the second transistor T2 are both N-channel transistors, the method may include the following steps.

In the first mode, the first scanning line S1 and the second scanning line S2 transmit a high-level signal (enable signal) to turn on the first switch SW1 and the second switch SW2. The first data line D1 and the second data line D2 transmit the voltage signal. The peek-proof electrode E2 receives the voltage signal transmitted by the first data line D1 and the pixel electrode E1 receives the voltage signal transmitted by the second data line D.

As shown in FIG. 29, in the second mode, the first scanning line S1 transmits a low-level signal (disable signal) to turn off the first switch SW1, the second scanning line S2 transmits a high-level signal (enable signal) to turn on the second switch SW2, the first data line D1 transmits a voltage signal and the second data line D2 does not transmit the voltage signal, and the pixel electrode E1 receives the voltage signal transmitted by the data line D and the peek-proof electrode E2 cannot receive the voltage signal.

In an embodiment of the present disclosure, referring to FIG. 1 and FIG. 11, the control terminal of the first switch SW1 is electrically connected to the first scanning line S1, and the control terminal of the second switch SW2 is electrically connected to the second scanning line S2. As shown in FIG. 28 and FIG. 29, the method provided by this embodiment of the present disclosure includes the following steps.

In the first mode, the first scanning line S1 transmits a first enable signal to turn on the first switch SW1, and the second scanning line S2 transmits a second enable signal to turn on the second switch SW2.

In the second mode, the first scanning line S1 transmits a disable signal to turn off the first switch SW1, and the second scanning line S2 transmits a second disable signal to turn on the second switch SW2.

Figure 30:
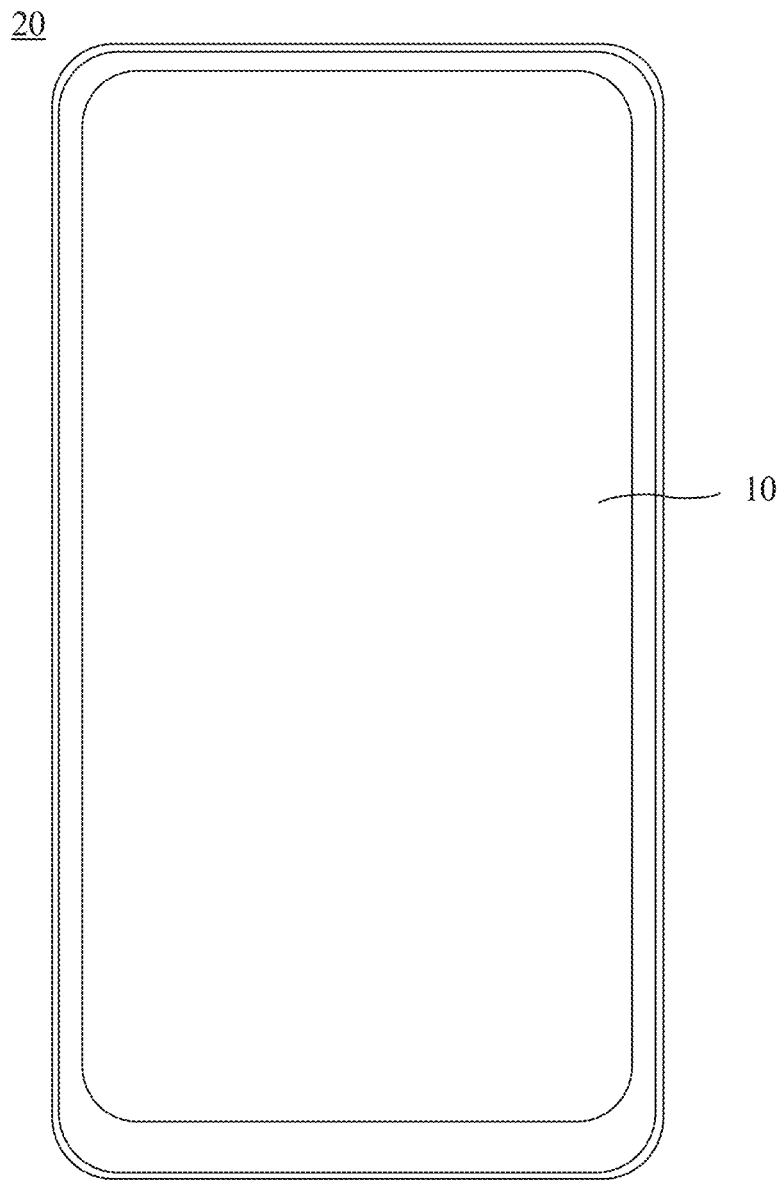
FIG. 30 is a schematic view of a display device according to an embodiment of the present disclosure.

FIG. 30 is a schematic view of a display device according to an embodiment of the present disclosure.

The present disclosure provides a display device 20. As shown in FIG. 30, the display device 20 includes the display panel 10 provided in the above embodiments. The display panel 10 is driven with the method in the above embodiments. The display device 20 may be a mobile phone. In addition, the display device 20 may also be a computer, a television, and other electronic device.

By providing the peek-proof electrode E2 and controlling whether the peek-proof electrode E2 receives a voltage signal, the display device 20 provided by the embodiments of the present disclosure can switch the display mode of the display panel between a peek-proof mode (first mode) and a non-peek-proof mode (second mode).

The above description merely describes preferred embodiments of the present disclosure and shall not be illustrated as limiting the present disclosure. Any modification, equivalent replacement and improvement within the spirit and principle of the present disclosure shall be included within a scope of the present disclosure.

What is claimed is:

1. A display panel, comprising:
   a first substrate;
   a display dielectric layer located at a side of the first substrate;
   pixel electrodes and peek-proof electrodes, all of the pixel electrodes and the peek-proof electrodes being arranged between the first substrate and the display dielectric layer; and
   a light-shielding structural layer comprising a light-shielding structure and a hollow-out portion, wherein along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel,
   wherein the display panel further comprises data lines, a first switch, and a second switch, and
   wherein one of the peek-proof electrodes is electrically connected to one of the data lines through the first switch, and one of the pixel electrodes is electrically connected to one of the data lines through the second switch different from the first switch.

2. The display panel according to claim 1, wherein, along the direction perpendicular to the plane of the display panel, the light-shielding structure covers the peek-proof electrodes.

3. The display panel according to claim 1, wherein the peek-proof electrodes and the pixel electrodes are provided on a same layer.

4. The display panel according to claim 1,
   wherein at least one of the peek-proof electrodes and an adjacent pixel electrode of the pixel electrodes are electrically connected to a same data line of the data lines respectively through the first switch and the second switch.

5. The display panel according to claim 4, wherein the first switch comprises a first transistor, and the second switch comprises a second transistor; and
   wherein at least one of the peek-proof electrodes and an adjacent pixel electrode of the pixel electrodes are respectively electrically connected to a first electrode of the first transistor and a first electrode of the second transistor; and a second electrode of the first transistor and a second electrode of the second transistor are reused as one electrode and electrically connected to a same one of the data lines.

6. The display panel according to claim 4, wherein a control terminal of the first switch is electrically connected to a first scanning line, and a control terminal of the second switch is electrically connected to a second scanning line.

7. The display panel according to claim 6, wherein, along the direction perpendicular to the plane of the display panel, the first scanning line does not overlap with the second switch, and the second scanning line does not overlap with the first switch.

8. The display panel according to claim 6, wherein an extension direction of the first scanning line is the same as an extension direction of a main body of one of the data lines, and the extension direction of the first scanning line is intersected with an extension direction of the second scanning line.

9. The display panel according to claim 8, wherein, along the direction perpendicular to the plane of the display panel, the first scanning line overlaps with the data lines; or
wherein the first scanning line comprises a main portion and a protrusion that are electrically connected to each other; and along the direction perpendicular to the plane of the display panel, the main portion at least partially overlaps with the data lines, and the protrusion overlaps with the first switch; or
wherein the first scanning line comprises a first portion and a second portion that are electrically connected to each other; and along the direction perpendicular to the plane of the display panel, the first portion overlaps with the second scanning line, and the second portion does not overlap with the second scanning line; and the first portion and the second scanning line are provided on different layers, and the second portion and the second scanning line are provided on a same layer.

10. The display panel according to claim 6, wherein, along the direction perpendicular to the plane of the display panel, the peek-proof electrodes do not overlap with the data lines and do not overlap with the first scanning line; or
wherein, along the direction perpendicular to the plane of the display panel, the peek-proof electrode overlaps with at least one of the data line and the first scanning line.

11. The display panel according to claim 6, wherein the first switch comprises a first transistor, and the second switch comprises a second transistor; and wherein the first scanning line is located at a side of a semiconductor layer of the first transistor away from the light exit surface of the display panel, and the second scanning line is located at a side of a semiconductor layer of the second transistor adjacent to the light exit surface of the display panel; or the second scanning line is located at a side of a semiconductor layer of the second transistor away from the light exit surface of the display panel, and the first scanning line is located at a side of a semiconductor layer of the first transistor adjacent to the light exit surface of the display panel; or
wherein a film layer of the first scanning line is located between a film layer of the second scanning line and a film layer of the data lines; or a film layer of the second scanning line is located between a film layer of the first scanning line and a film layer of the data lines.

12. The display panel according to claim 6, comprising a plurality of first scanning lines, wherein at least two first scanning lines of the plurality of first scanning lines are connected with each other.

13. The display panel according to claim 12, comprising a plurality of first scanning lines, wherein all first scanning lines of the plurality of first scanning lines are connected with each other.

14. The display panel according to claim 1, wherein the data lines comprise a first data line, and a second data line, and
wherein one of the peek-proof electrodes is electrically connected to the first data line through the first switch, and one of the pixel electrodes is electrically connected to the second data line through the second switch.

15. The display panel according to claim 1, wherein one of the peek-proof electrodes is located between at least adjacent pixel electrodes of the pixel electrodes along a first direction, and/or between at least adjacent pixel electrodes of the pixel electrodes along a second direction; wherein the first direction is intersected with the second direction.

16. The display panel according to claim 15, wherein the pixel electrodes comprise a green sub-pixel electrode, and one of the peek-proof electrodes is adjacent to the green sub-pixel electrode.

17. The display panel according to claim 1, wherein a display mode of the display panel comprises a first mode, the display panel achieves narrow viewing angle (NVA) display in the first mode, and in the first mode, at least one of the pixel electrodes and at least one of the peek-proof electrodes receive a voltage signal.

18. A method for driving the display panel, the display panel comprising:
a first substrate;
a display dielectric layer located at a side of the first substrate;
pixel electrodes and peek-proof electrodes, all of the pixel electrodes and the peek-proof electrodes being arranged between the first substrate and the display dielectric layer; and
a light-shielding structural layer comprising a light-shielding structure and a hollow-out portion, wherein along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel,
wherein a display mode of the display panel comprises a first mode and a second mode, and wherein the method comprises:
controlling, in the first mode, one of the pixel electrodes and one of the peek-proof electrodes to respectively receive a voltage signal, such that the display panel achieves a narrow viewing angle (NVA) display; and
controlling, in the second mode, one of the pixel electrodes to receive a voltage signal and none of the peek-proof electrodes receives a voltage signal, such that the display panel achieves wide viewing angle (WVA) display.

19. The method according to claim 18, wherein the display panel further comprises data lines, a first switch, and a second switch; wherein at least one of the peek-proof electrodes and an adjacent pixel electrode of the pixel electrodes are electrically connected to a same data line of the data lines through the first switch and the second switch; and wherein the method comprises:
controlling, in the first mode, the data line to transmit a voltage signal; and turning on the first switch and the second switch, such that the voltage signal transmitted on the data line is transmitted to the peek-proof electrode and the pixel electrode through the first switch and the second switch; and controlling, in the second mode, the data line to transmit a voltage signal; and turning off the first switch and turning on the second switch, such that the voltage signal transmitted on the data line is transmitted to the pixel electrode through the second switch.

20. A display device, comprising a display panel, the display panel comprising:

a first substrate;

a display dielectric layer located at a side of the first substrate;

pixel electrodes and peek-proof electrodes, all of the pixel electrodes and the peek-proof electrodes being arranged between the first substrate and the display dielectric layer; and a light-shielding structural layer comprising a light-shielding structure and a hollow-out portion, wherein, along a direction perpendicular to a plane of the display panel, the peek-proof electrodes overlap with the light-shielding structure, and the pixel electrodes overlap with the hollow-out portion; and the light-shielding structural layer is located at a side of the peek-proof electrodes adjacent to a light exit surface of the display panel, wherein the display panel further comprises data lines, a first switch, and a second switch, and wherein one of the peek-proof electrodes is electrically connected to one of the data lines through the first switch, and one of the pixel electrodes is electrically connected to one of the data lines through the second switch different from the first switch.

* * * * *